(12) United States Patent
Wiese

(10) Patent No.: US 10,777,983 B1
(45) Date of Patent: Sep. 15, 2020

(54) WATER-PROOFING AND FIRE-PROOFING COMBINED FLASHING AND ELECTRICAL JUNCTION BOX SYSTEM

(71) Applicant: Michael S. Wiese, Aumsville, OR (US)

(72) Inventor: Michael S. Wiese, Aumsville, OR (US)

( * ) Notice: Subject to any disclaimer, the term of this patent is extended or adjusted under 35 U.S.C. 154(b) by 0 days.

(21) Appl. No.: 16/401,091

(22) Filed: May 1, 2019

Related U.S. Application Data

(63) Continuation of application No. 15/902,967, filed on Feb. 22, 2018, now Pat. No. 10,297,997.

(51) Int. Cl.
| | |
|---|---|
| *H05K 3/08* | (2006.01) |
| *H02G 3/08* | (2006.01) |
| *H05K 5/06* | (2006.01) |
| *H01H 13/14* | (2006.01) |
| *H01R 24/30* | (2011.01) |
| *H01R 25/00* | (2006.01) |

(52) U.S. Cl.
CPC ............ *H02G 3/088* (2013.01); *H01H 13/14* (2013.01); *H01R 24/30* (2013.01); *H01R 25/006* (2013.01); *H02G 3/085* (2013.01); *H05K 5/06* (2013.01)

(58) Field of Classification Search
CPC ..................................................... H02G 3/088
USPC .......................................................... 174/53
See application file for complete search history.

(56) References Cited

U.S. PATENT DOCUMENTS

| | | |
|---|---|---|
| 2,659,765 A | 11/1953 | Dunn |
| 3,701,451 A | 10/1972 | Schindler et al. |
| 3,955,463 A | 5/1976 | Hoehn |
| 4,051,322 A | 9/1977 | Park et al. |
| 4,105,862 A | 8/1978 | Hoehn |
| 4,188,854 A | 2/1980 | Hoehn |
| 4,356,343 A | 10/1982 | Larson |
| 4,389,535 A | 6/1983 | Slater et al. |
| 4,414,427 A | 11/1983 | Slater et al. |
| 4,424,406 A | 1/1984 | Slater et al. |
| 4,673,097 A | 6/1987 | Schuldt |
| 4,920,708 A * | 5/1990 | MacLeod ................ E06B 1/006 248/915 |
| 5,287,665 A | 2/1994 | Rath, Jr. |
| 5,578,791 A * | 11/1996 | Bosse, Jr. ................ H02G 3/10 174/481 |
| 5,722,208 A * | 3/1998 | Humphrey .............. F21S 8/033 174/502 |
| 5,740,936 A | 4/1998 | Nash |
| 5,952,610 A | 9/1999 | Bosse, Jr. |
| 6,051,786 A | 4/2000 | Gretz |
| 6,239,368 B1 | 5/2001 | Gretz |
| 6,395,984 B1 | 5/2002 | Gilleran |
| 6,596,938 B2 | 7/2003 | Gilleran |
| 6,649,835 B2 | 11/2003 | Gilleran |

(Continued)

OTHER PUBLICATIONS

Arlington, "Arlington Industries 8091F Siding Box Kits," https://www.amazon.com/Arlington-industries-siding-fixtures-25-pack/dp/B006N2TQ5O, at least as early as Jan. 26, 2018, 5 pages.

(Continued)

*Primary Examiner* — Sherman Ng
(74) *Attorney, Agent, or Firm* — Green, Howard & Mughal, LLP; Karen Dana Oster

(57) ABSTRACT

A combined flashing and electrical junction box system includes an enclosure subsystem and an expanse subsystem. Preferably, the enclosure subsystem and said expanse subsystem are both fireproof and waterproof.

20 Claims, 21 Drawing Sheets

(56) References Cited

U.S. PATENT DOCUMENTS

| | | | |
|---|---|---|---|
| 6,723,921 | B2 | 4/2004 | Vagedes |
| 6,774,304 | B1 | 8/2004 | Gretz |
| 7,117,591 | B1 | 10/2006 | Gretz |
| 7,361,833 | B2 | 4/2008 | Dinh |
| 7,408,112 | B1 | 8/2008 | Wimberly |
| 7,528,322 | B1 | 5/2009 | Gretz |
| 7,674,974 | B1 * | 3/2010 | Shotey .................. H02G 3/088 174/480 |
| D702,198 | S | 4/2014 | Gretz |
| 8,906,500 | B2 | 12/2014 | Peng et al. |
| 8,933,331 | B1 * | 1/2015 | Gretz .................... H02G 3/121 174/50 |
| 8,933,350 | B1 | 1/2015 | Gretz |
| 9,018,524 | B2 | 4/2015 | Dinh |
| D736,715 | S | 8/2015 | Gretz |
| 9,109,359 | B1 | 8/2015 | Coscarella |
| 9,260,864 | B2 | 2/2016 | Cole et al. |
| 9,404,606 | B2 | 8/2016 | Coscarella |
| D766,460 | S | 9/2016 | Everhart, II et al. |
| 9,650,791 | B2 | 5/2017 | Cole et al. |
| 9,752,328 | B2 | 9/2017 | Everhart, II et al. |
| 2002/0125031 | A1 * | 9/2002 | Gilleran ................ H02G 3/088 174/58 |
| 2007/0055007 | A1 | 3/2007 | Pagel |
| 2007/0205011 | A1 | 9/2007 | Dinh |
| 2008/0157518 | A1 | 7/2008 | Cecilio |

OTHER PUBLICATIONS

Arlington, "Black Button NM Cable Connectors," www.aifittings.com, copyright 2006 Arlington Industries, Inc., at least as early as Jan. 31, 2018, 2 pages.

Arlington, "FR101F Line Drawing," http://www.aimedia.co/media/line-drawings/FR101F.pdf, at least as early as Jan. 11, 2019, 1 page.

Arlington, "Non-Metallic FR Series & Device Fixture Boxes," http://www.aimedia.co/media/spec-sheets/FR_SERIES.pdf, copyright 2012 Arlington Industries, inc., at least as early as Jan. 11, 2019, 2 pages.

Arlington, "Siding Mounting Blocks, L-8," http://www.aifittings.com/catalog/files/pdf/sections/L-8.pdf, at least as early as Jan. 11, 2019, 1 page.

Chi Mei Corporation, "Safety Data Sheet for Wonderloy PC Alloy," Revision date Nov. 30, 2015, 9 pages.

Home Depot, "3-1/2 in. Round Ceiling/Fixture Outlet Box," https://www.homedepot.com/p/3-1-2-in-round-ceiling-fixture-outlet-box-case-of-50-3080-9/202435301, at least as early as Jan. 26, 2018, 4 pages.

Platt,"Hubbell-Raco—287," www.platt.com/pratt-electric -supply/ceiling-boxes-accessories-pans/hubbell-raco/287/product.aspx?zpid=272214, copyright 2001-2018 Platt Electric Supply, at least as early as Jan. 25, 2018, 3 pages.

Portland Products Group, "New Construction Line," at least as early as Feb. 15, 2018, 1 page.

Portland Products Group, "PPG Product Catalog, Fiber Cement Mounting Blocks," at least as early as Feb. 8, 2018, 12 pages.

Prospector, "Wonderloy PC-510 Data Sheet," www.ulprospector.com, last updated Jun. 8, 2016, 3 pages.

Quickflash Weatherproofing Products Inc., "Part #E-4/0 SB," www.QuickflashProducts.com, dated May 26, 2006, 1 page.

Quickflash Weatherproofing Products Inc., "Electrical Cross Reference Sheet: Electrical Flashing Panels for Manufactured Boxes," www.QuickflashProducts.com, at least as early as Feb. 8, 2018, 1 page.

UL LLC, "Component Plastics Wonderloy PC-510(+) data sheet," revised Aug. 8, 2012, 2 pages.

* cited by examiner

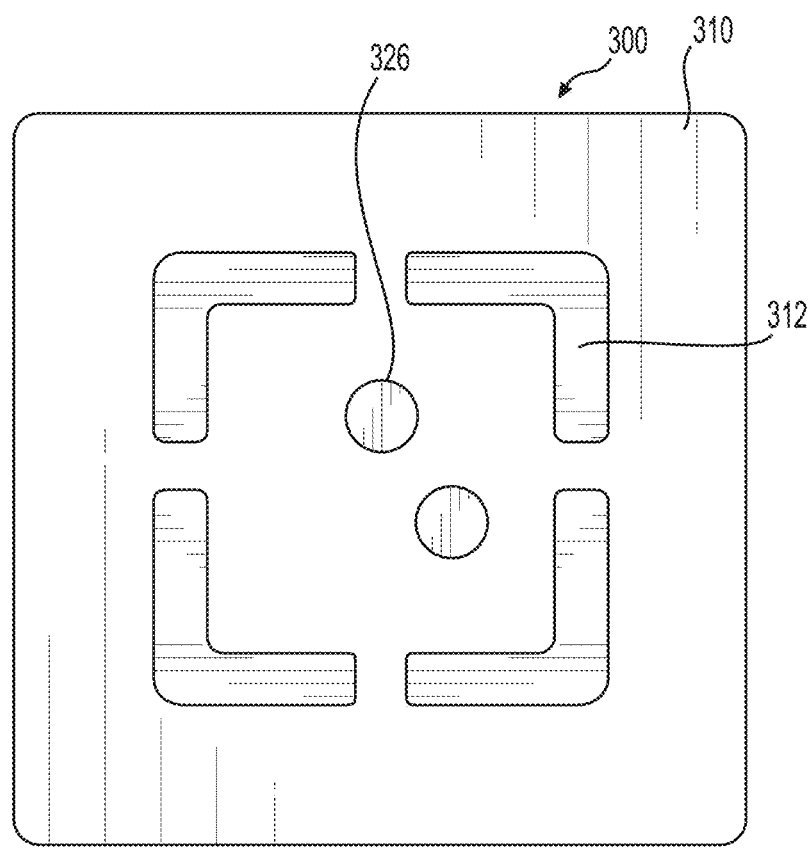
FIG. 25
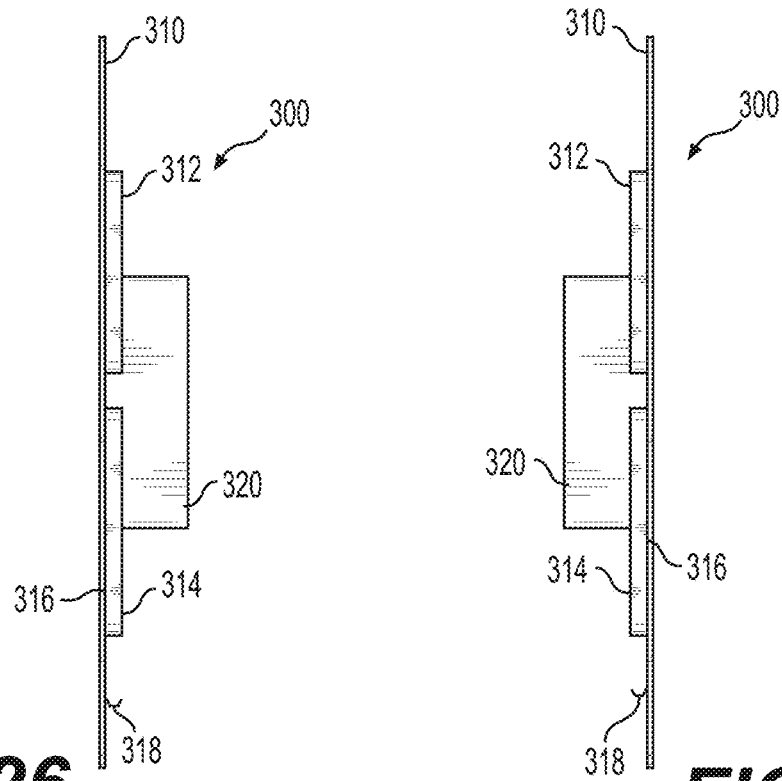
FIG. 26  FIG. 27

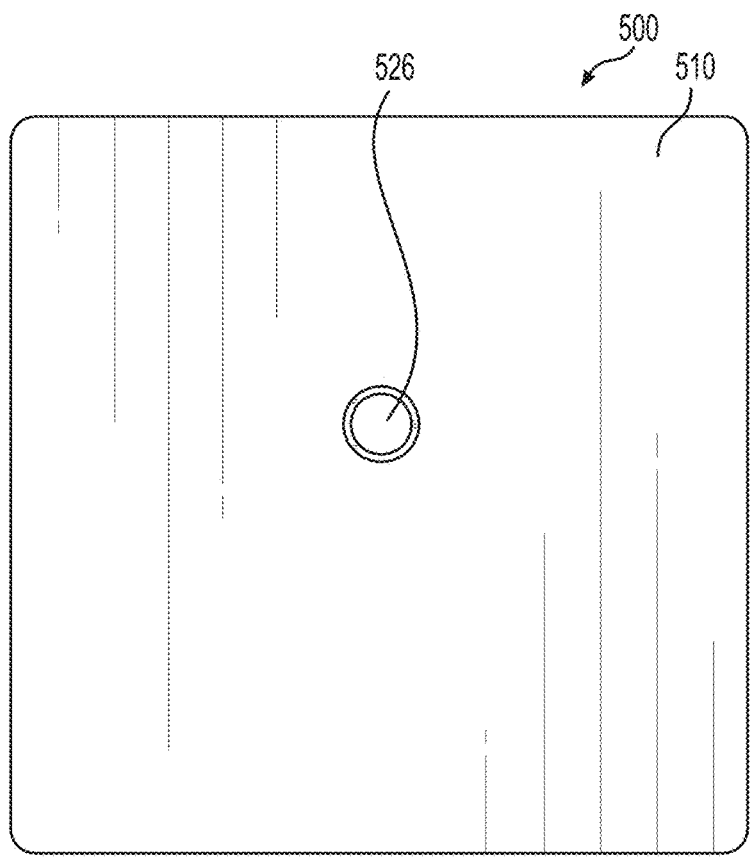
FIG. 39
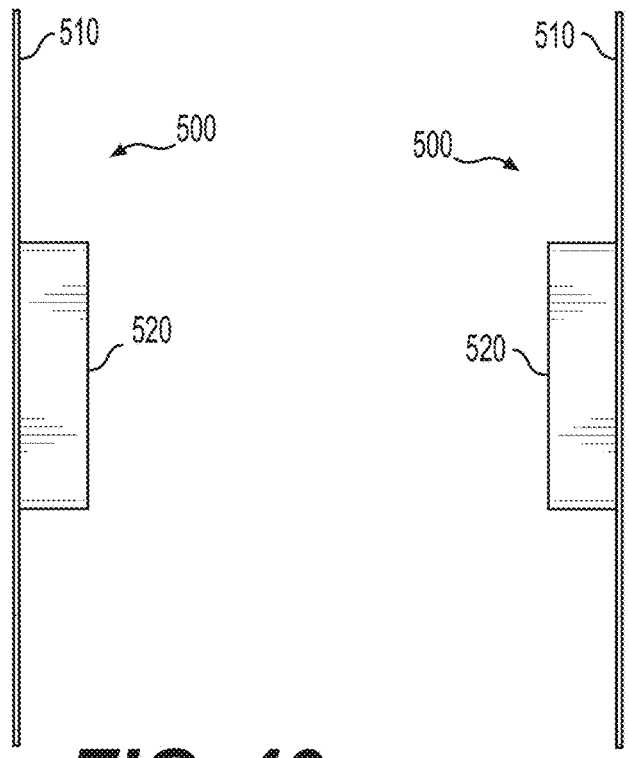
FIG. 40
FIG. 41

WATER-PROOFING AND FIRE-PROOFING COMBINED FLASHING AND ELECTRICAL JUNCTION BOX SYSTEM

The present application is an application claiming the benefit of U.S. patent application Ser. No. 15/902,967, filed Feb. 22, 2018. The present application is based on and claims priority from this application, the disclosure of which is hereby expressly incorporated herein by reference in its entirety.

TECHNICAL FIELD

The present disclosure describes systems, apparatuses, and methods that generally relate to the technical field of construction, specifically relate to the technical field of combined flashing and electrical junction box systems, and in particular relate to combined flashing and electrical junction box systems that provide both water-proofing and fire-proofing.

BACKGROUND OF THE INVENTION

The outside face of an exterior building wall is subjected to the elements and, in particular, moisture (e.g. rain or other water). Accordingly, during the construction of a building, it is imperative that any structure(s) (e.g. lighting, pipes, wires, electrical boxes, vents, windows, and doors) projecting from the outside face must be installed so that the outside face remains waterproof (moisture-proof). Using a pipe as an example of a projecting structure, water tends to travel rearward (from the distal end of the pipe toward the building) on the exterior of the pipe toward and, if not properly waterproofed, into the building (which includes behind any water resistive resistant (WRB) and/or into the building walls). Water entering a building can cause substantial damage.

"Flashing" is a term that generally has been used to refer to thin pieces of impervious material (e.g. rubber, tar, asphalt, synthetic polymers, or various metals) installed to prevent the passage of water into a building from "openings" or "interruptions" (including the intersection of a projecting structure and the outside face) in an outside face of a wall.

Flashing may be installed during construction of a building or retrofitted onto a completed building to prevent water from entering the building. Although there is no standard way to install flashing, the installation of flashing is a multi-step process. Traditional flashing systems use gravity, sealing tapes, or a combination of both to direct water away from interruptions in the outside face. Installed properly, flashing can prevent damage to a building. Flashing that is installed improperly, however, can lead to water entering the building.

Every building has many interruptions from projecting structure and, therefore, installation of flashing can require a significant amount of time and labor. For this reason, there are known systems that attempt to reduce the time and labor burden of the installation of flashing. Examples of this are the QUICKFLASH® products produced by Weatherproofing Products Inc. including the "sub exterior weather-proof flashing panel mount for electrical junction box" described in U.S. Pat. No. 6,395,984 to Gilleran, the "exterior electrical box waterproofing system" described in U.S. Pat. No. 6,596,938 to Gilleran, and the "sub-exterior electrical box weatherproofing system" described in U.S. Pat. No. 6,649,835 to Gilleran.

FIGS. 1 and 2 show a prior art flashing product 100 and an installed electrical box interruption 110 prior to (FIG. 1) and after (FIG. 2) the installation of the flashing product 100. As shown in FIG. 1, there is a weather resistant barrier 120 over subsiding 122. The electrical box interruption 110 is pre-installed in these figures. (This would generally be the case in remodels. Further, this might be the case for some new construction when the normal construction process is not followed.) The flashing product 100 has an opening (surrounded by rim 102) that is positioned around the exterior of the electrical box interruption 110. Put another way, when the flashing product 100 is installed, the electrical box interruption 110 is surrounded by the rim 102 of the opening of the flashing product 100. The flashing product 100 is then secured using weather resistant barrier tape 130 (FIG. 2). Weatherproofing Products Inc. also produces a flashing product (QUICKFLASH® Part # E-4/0 SB) that is designed to be used with specified electrical 4/0 metal electrical boxes if the flashing product is to be used in electrical applications.

BRIEF SUMMARY OF THE INVENTION

The present disclosure describes systems, apparatuses, and methods that generally relate to the technical field of construction, specifically relate to the technical field of combined flashing and electrical junction box systems (combination systems), and in particular relate to combined flashing and electrical junction box systems that provide both water-proofing and fire-proofing.

A combination system as disclosed herein includes an enclosure subsystem and an expanse subsystem. The enclosure subsystem has a back and a peripheral wall. The expanse subsystem is preferably substantially coextensive with said back of said enclosure subsystem. The enclosure subsystem is preferably centrally positioned in relation to said expanse subsystem. Preferably, the enclosure subsystem and said expanse subsystem are an integral unit. Preferably, the enclosure subsystem and said expanse subsystem are both fireproof and waterproof.

Preferred enclosure subsystems are designed to accommodate electrical wires safely and/or have at least one integral enclosure connector positioned therein.

Preferred expanse subsystems are flexible. Preferred expanse subsystems have an embossed pattern thereon. The embossed pattern may substantially surround said enclosure subsystem. The embossed pattern preferably includes raised portions and at least one gap between said raised portions, said embossed pattern for directing water. The embossed pattern may have a forward portion and a rear portion, the distance between said upper rim and said forward portion being equivalent to a thickness of an accessory block. The distance between said peripheral wall and an outer edge of said expanse subsystem preferably has a length that is approximately equal to the length, width, or diameter of said enclosure subsystem.

Four examples of the combination system are disclosed. The first exemplary combination system has an expanse subsystem with an embossed pattern and an enclosure subsystem with a circular peripheral wall. The second exemplary combination system has an expanse subsystem with an embossed pattern and an enclosure subsystem with a square or rectangular peripheral wall. The third exemplary combination system has an expanse subsystem without embossing and an enclosure subsystem with a circular peripheral wall. The fourth exemplary combination system has an expanse subsystem without embossing and an enclosure subsystem with a square or rectangular peripheral wall.

Objectives, features, combinations, and advantages described and implied herein will be more readily understood upon consideration of the following detailed description of the invention, taken in conjunction with the accompanying drawings. The subject matter described herein is also particularly pointed out and distinctly claimed in the concluding portion of this specification.

BRIEF DESCRIPTION OF THE SEVERAL VIEWS OF THE DRAWINGS

The accompanying drawings illustrate various exemplary combined flashing and electrical junction box systems (combination systems), components of various exemplary combination systems, and/or provide teachings by which the various exemplary combination systems are more readily understood.

FIG. 25 is a back view of the second exemplary combination system of FIG. 23.

FIG. 26 is a first side view of the second exemplary combination system of FIG. 23.

FIG. 27 is a second side view of the second exemplary combination system of FIG. 23.

FIG. 39 is a back view of the fourth exemplary combination system of FIG. 37.

FIG. 40 is a first side view of the fourth exemplary combination system of FIG. 37.

FIG. 41 is a second side view of the fourth exemplary combination system of FIG. 37.

Figure 1:
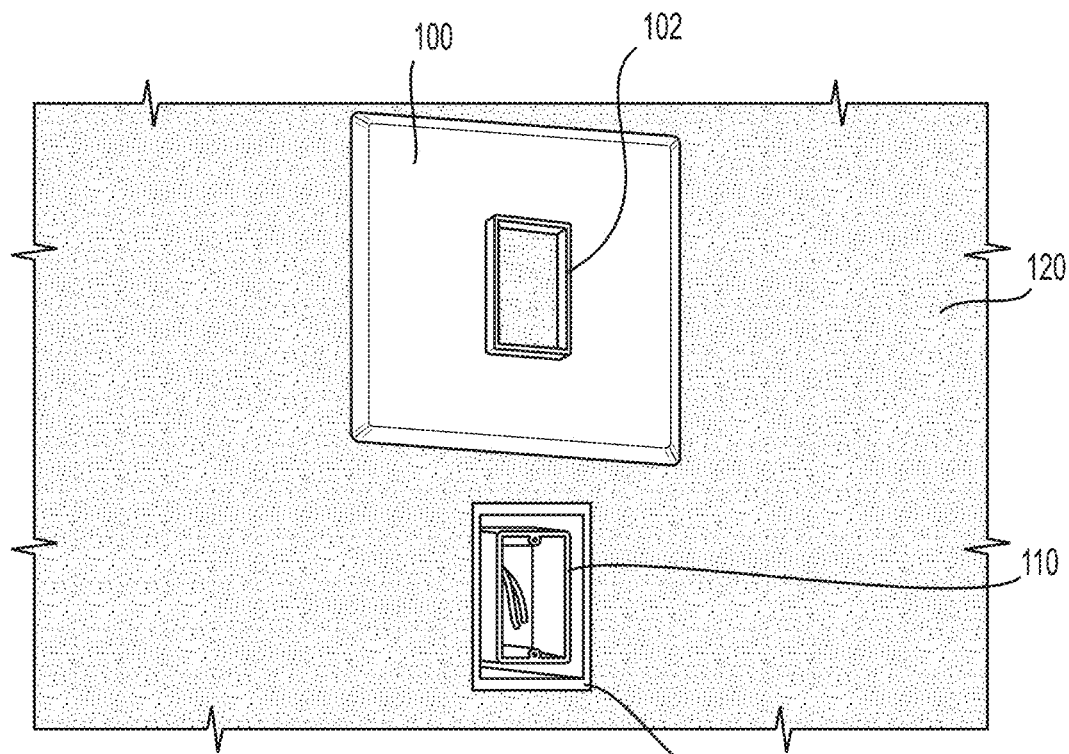
FIG. 1 is a front perspective view of a prior art flashing product and an installed electrical box interruption prior to the installation of the flashing product.
Figure 2:
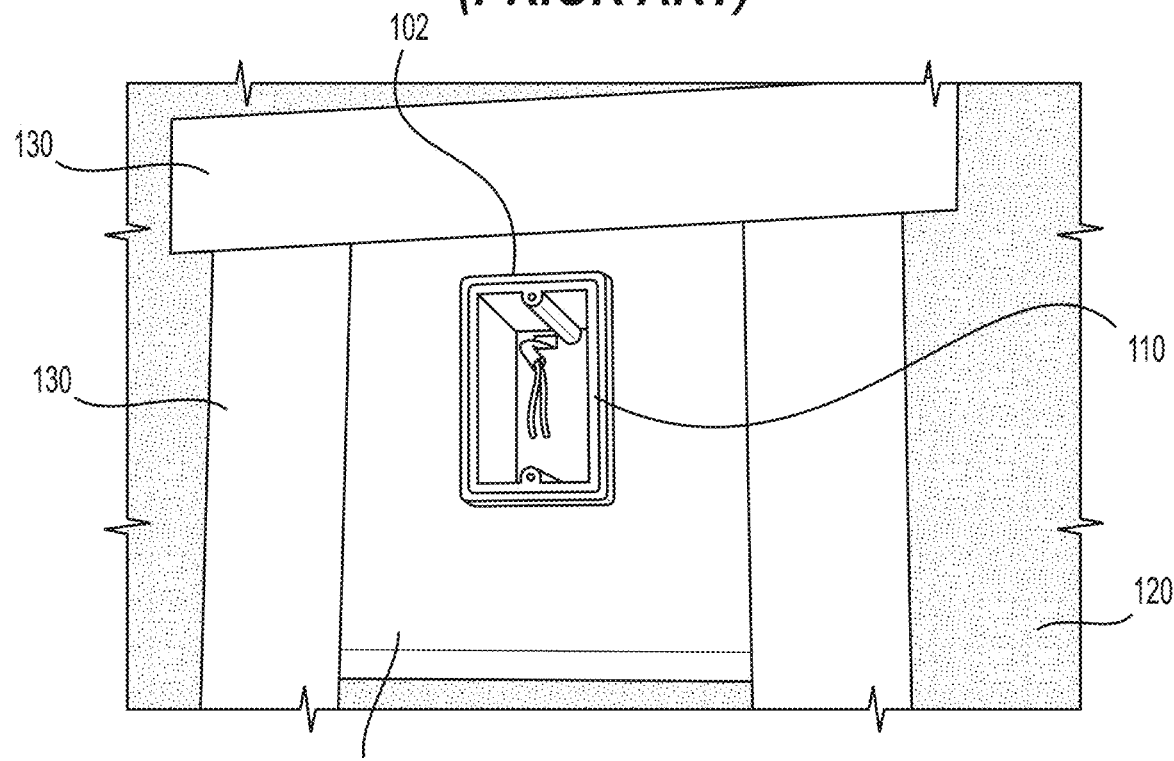
FIG. 2 is a front perspective view of the prior art flashing product of FIG. 1 after installation.

The drawing figures are not necessarily to scale. Certain features or components herein may be shown in somewhat schematic form and some details of conventional elements may not be shown or described in the interest of clarity and conciseness. The drawing figures are hereby incorporated in and constitute a part of this specification.

DETAILED DESCRIPTION OF THE INVENTION

The present disclosure describes combined flashing and electrical junction box systems, apparatuses, and methods (referred to generally as "combination systems"). The combination systems function both as flashing and as electrical junction boxes. The combination systems provide both water-proofing and fire-proofing. The combination systems preferably require less installation time and steps than was required for the prior art in which the flashing is distinct from electrical junction boxes. The combination systems preferably reduce or eliminate the need for additional tools for installation that was required for the installation of prior art. The combination systems described herein preferably facilitate a method for installation that does not create airborne particles (e.g. free silica) since installation does not require "cutting in" (and, therefore, special vacuum systems are not necessary).

Figure 16:
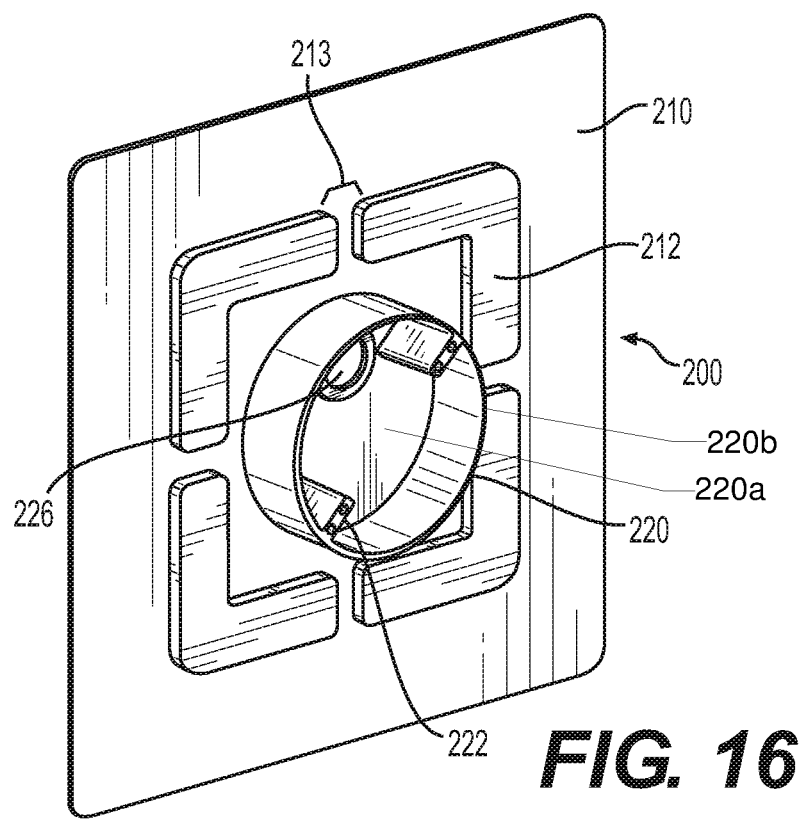
FIG. 16 is a perspective view of a first exemplary combination system.
Figure 17:
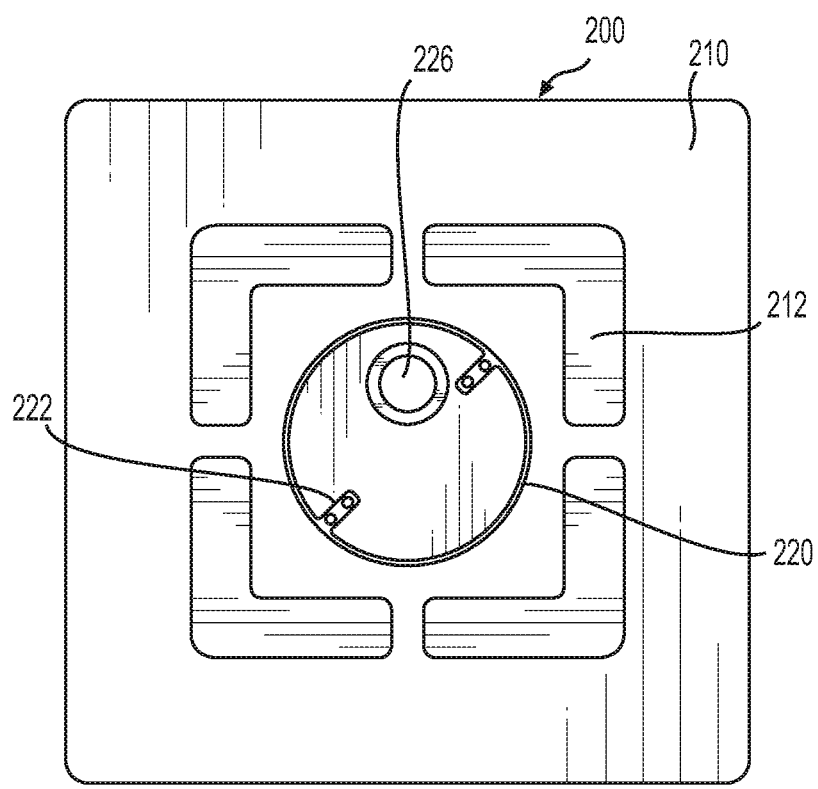
FIG. 17 is a front view of the first exemplary combination system of FIG. 16.
Figure 18:
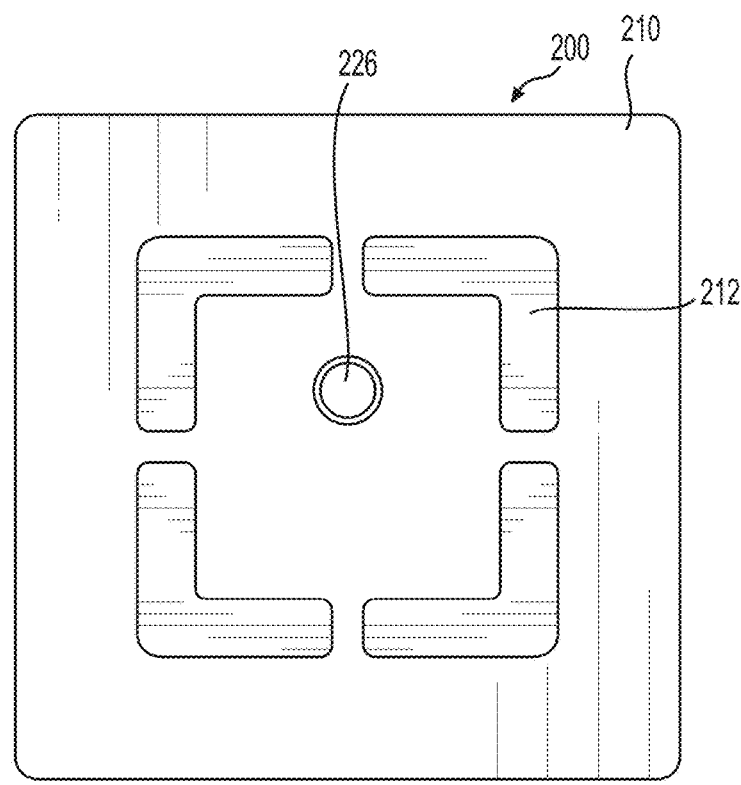
FIG. 18 is a back view of the first exemplary combination system of FIG. 16.
Figure 19:
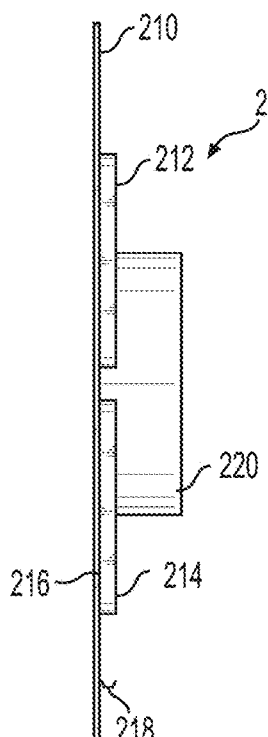
FIG. 19 is a first side view of the first exemplary combination system of FIG. 16.
Figure 20:
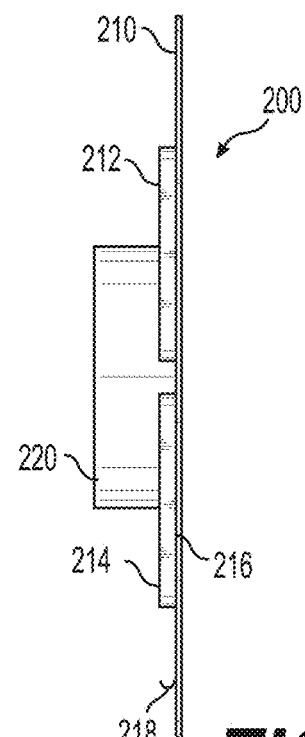
FIG. 20 is a second side view of the first exemplary combination system of FIG. 16.
Figure 21:
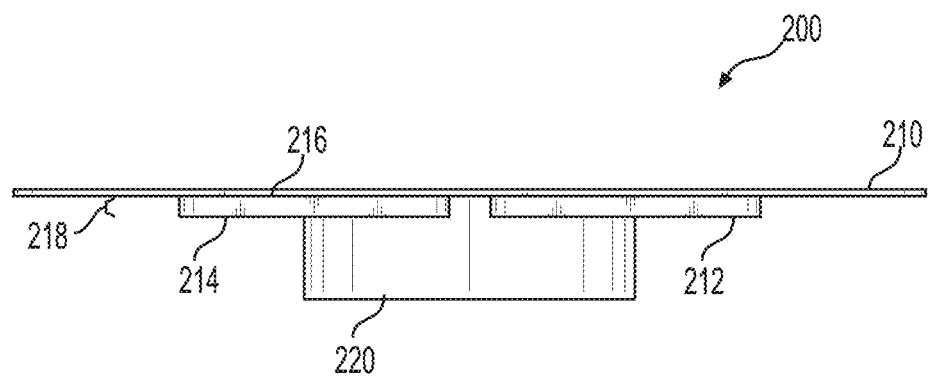
FIG. 21 is a top view of the first exemplary combination system of FIG. 16.
Figure 22:
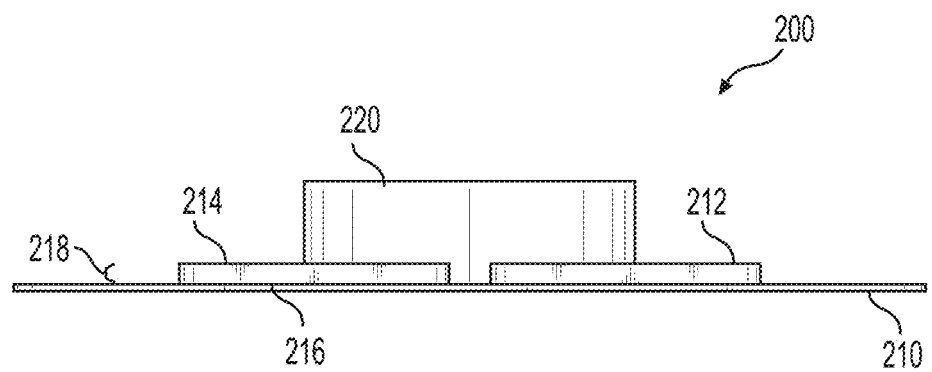
FIG. 22 is a bottom view of the first exemplary combination system of FIG. 16.
Figure 30:
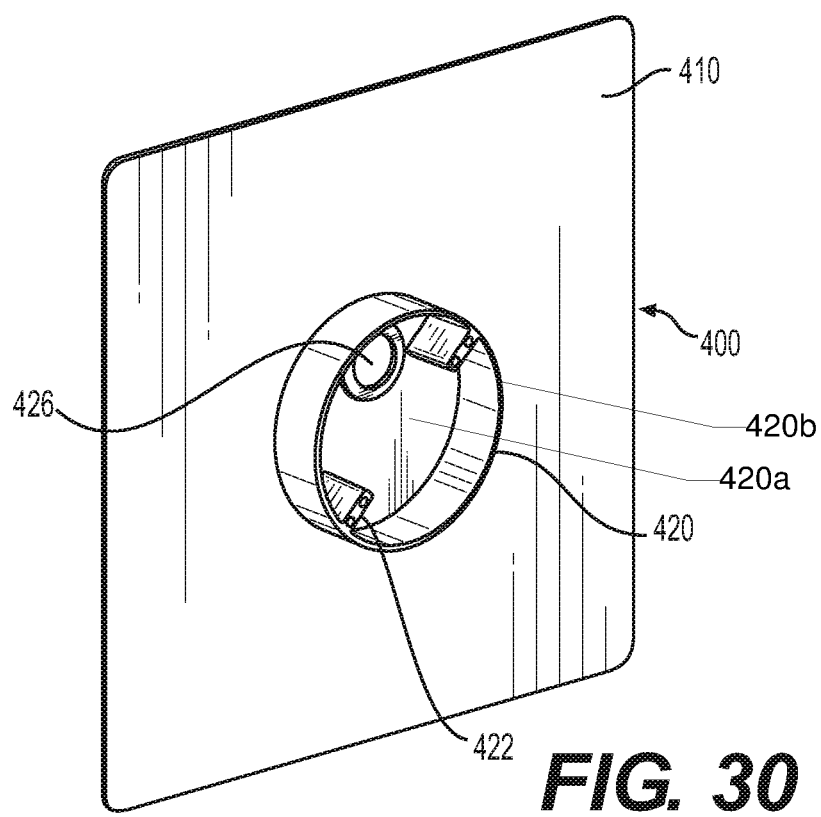
FIG. 30 is a perspective view of a third exemplary combination system.
Figure 31:
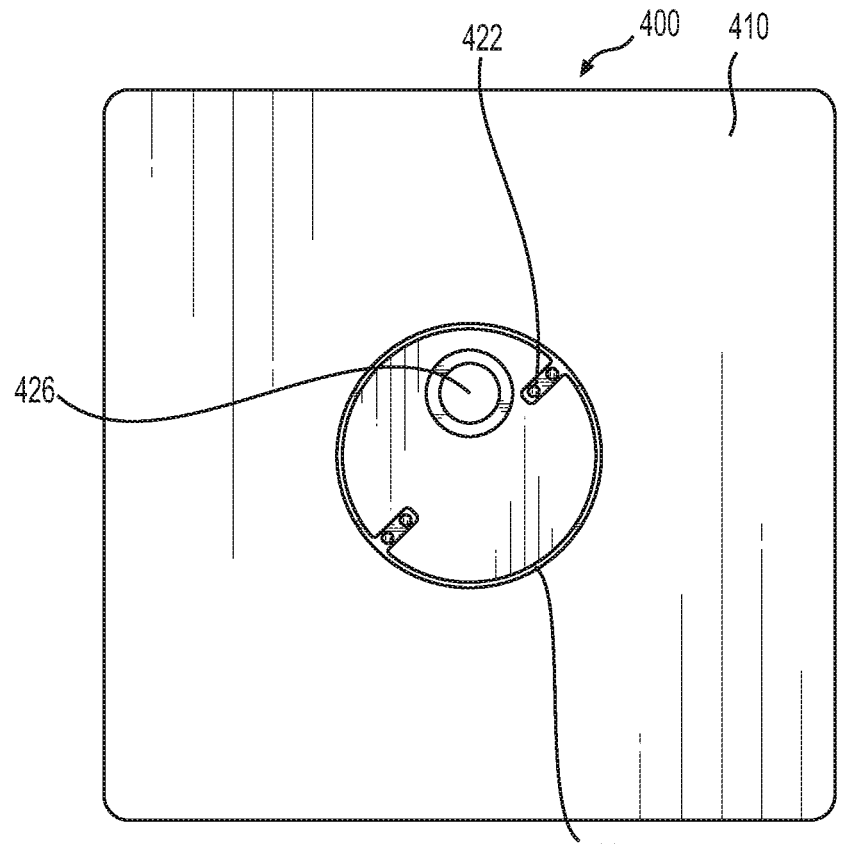
FIG. 31 is a front view of the third exemplary combination system of FIG. 30.
Figure 32:
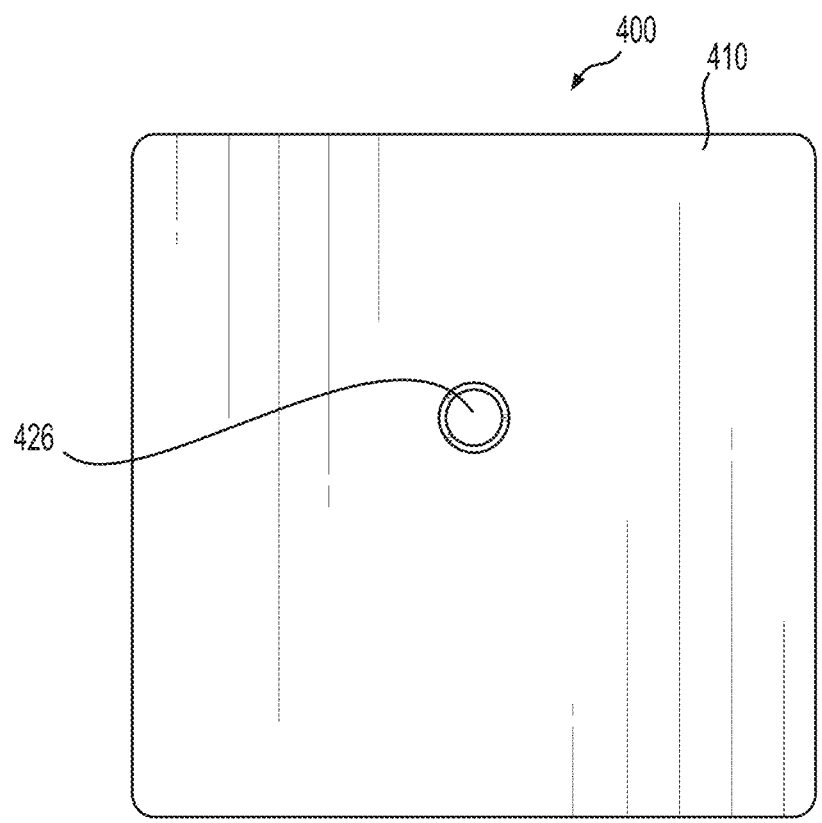
FIG. 32 is a back view of the third exemplary combination system of FIG. 30.
Figure 33:
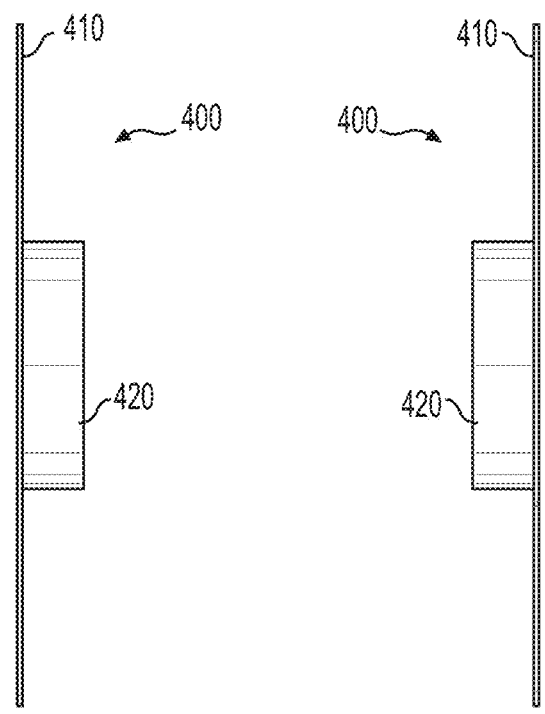
FIG. 33 is a first side view of the third exemplary combination system of FIG. 30.
Figure 34:
FIG. 34 is a second side view of the third exemplary combination system of FIG. 30.
Figure 35:
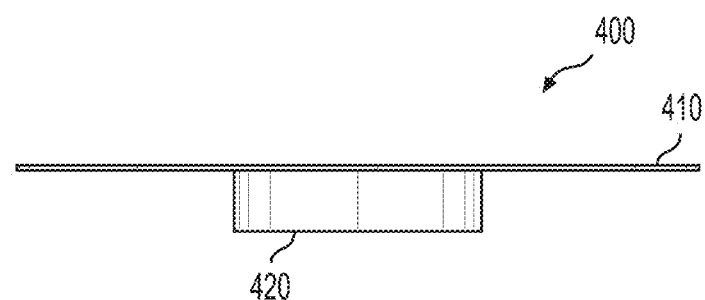
FIG. 35 is a top view of the third exemplary combination system of FIG. 30.
Figure 36:
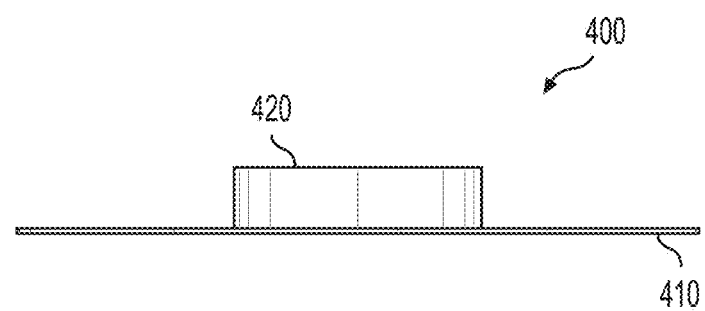
FIG. 36 is a bottom view of the third exemplary combination system of FIG. 30.
Figure 37:
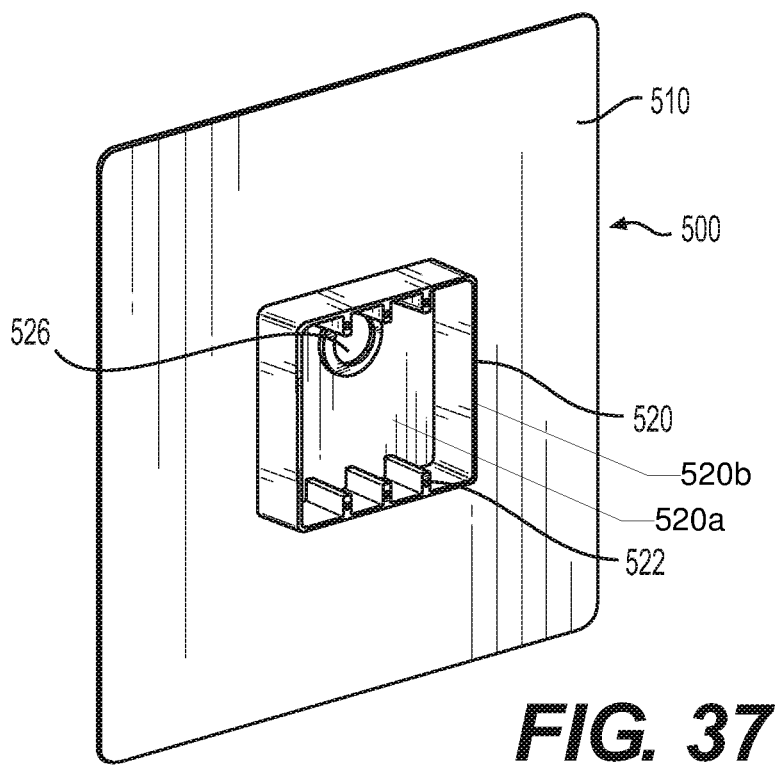
FIG. 37 is a perspective view of a fourth exemplary combination system.
Figure 38:
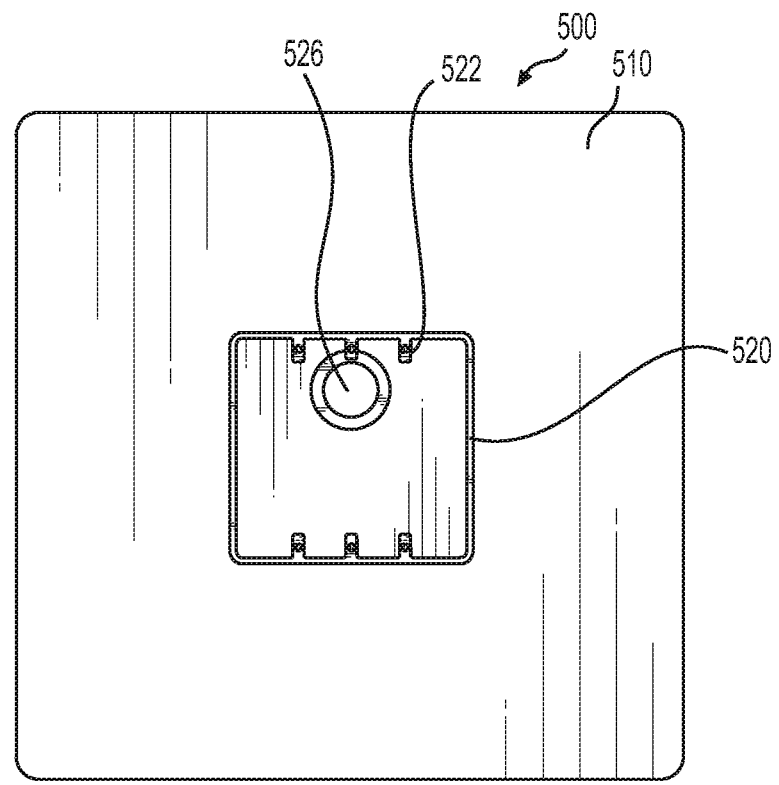
FIG. 38 is a front view of the fourth exemplary combination system of FIG. 37.
Figure 42:
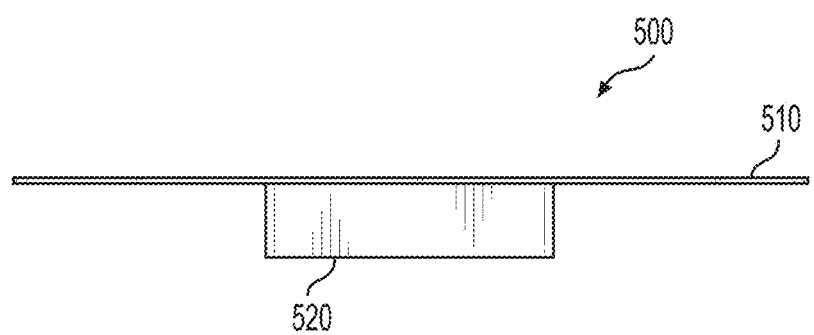
FIG. 42 is a top view of the fourth exemplary combination system of FIG. 37.
Figure 43:
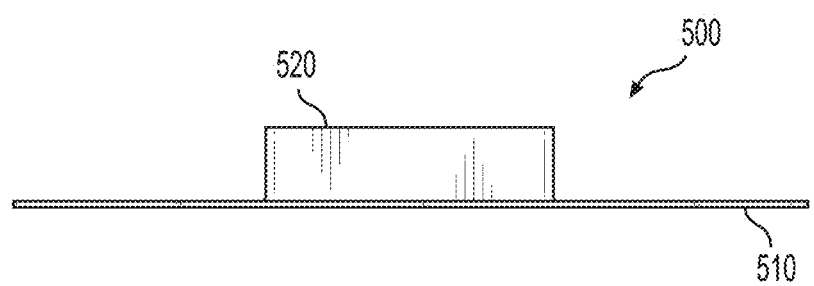
FIG. 43 is a bottom view of the fourth exemplary combination system of FIG. 37.

Each of the combination systems 200, 300, 400, 500 includes both an expanse subsystem 210, 310, 410, 510 and an enclosure subsystem 220, 320, 420, 520. The enclosure subsystem 220, 320, 420, 520 is preferably substantially centrally located on the expanse subsystem 210, 310, 410, 510. Preferably, the enclosure subsystem 220, 320, 420, 520 and the expanse subsystem 210, 310, 410, 510 are of a unitary construction. Preferred enclosure subsystems 220, 320, 420, 520, which essentially function as electrical junction boxes, have a back 220a (FIG. 16), 320a (FIG. 23), 420a (FIG. 30), 520a (FIG. 37) and a peripheral wall 220b (FIG. 16), 320b (FIG. 23), 420b (FIG. 30), 520b (FIG. 37). The back 220a, 320a, 420a, 520a is opposite an open "front" defined by the peripheral rim created by the peripheral wall 220b, 320b, 420b, 520b. The enclosure subsystems 220, 320, 420, 520, are designed to accommodate electrical wires. There are many laws, rules, regulations, and codes (e.g. National Electrical Code (NEC)) that dictate the size, shape, volume, and/or other dimensions of an enclosure to handle particular wires based on the quality of the wire (e.g. cubic inch rating), type of wire, the quantity of wires, and/or purpose of the wires. The size, shape, volume, and/or other dimensions of the enclosure subsystems 220, 320, 420, 520, would meet all of the laws, rules, and regulations. Preferred expanse subsystems 210, 310, 410, 510, which essentially function as flashing, are substantially coextensive (the majority being at the same level) with the backs of the enclosure subsystems 220, 320, 420, 520. Preferably, the distance between the peripheral wall 220b, 320b, 420b, 520b and the outer edge of the expanse subsystems 210, 310, 410, 510 has a length of at least 25% and no more that 200% of the length, width, and/or diameter of the enclosure subsystem 220, 320, 420, 520. In the shown preferred combination systems 200, 300, 400, 500, the distance between the peripheral wall 220b, 320b, 420b, 520b and the outer edge of the expanse subsystems 210, 310, 410, 510 has a length that is approximately equal to the length, width, and/or diameter of the enclosure subsystem 220, 320, 420, 520. Although described separately, preferably the expanse subsystem 210, 310, 410, 510 and the enclosure subsystem 220, 320, 420, 520 are an integral unit that together form the combination systems 200, 300, 400, 500.

Preferably, the expanse subsystem 210, 310, 410, 510 and the enclosure subsystem 220, 320, 420, 520 are made of a fireproof and waterproof material. Preferably, the material is sufficiently flexible to allow expanse subsystem 210, 310, 410, 510 to function as flashing. Preferred materials would also be strong enough for the enclosure subsystem 220, 320, 420, 520 to function as an electrical junction box, but would not get brittle and/or break over time and under extreme conditions (e.g. extreme cold and/or extreme heat). Preferably the material may be constructed using a method (e.g. molding) by which the expanse subsystem 210, 310, 410, 510 and the enclosure subsystem 220, 320, 420, 520 can be formed as an integral unit. Exemplary materials are any materials known or yet to be discovered that are able to function as set forth herein. One exemplary material is WONDERLOY® PC-510 which is a Polycarbonate+ABS (PC+ABS) product (Supplied by CHIMEI CORPORATION).

Exemplary combination systems may be better understood with reference to the drawings, but these combination systems are not intended to be of a limiting nature. The same reference numbers will be used throughout the drawings and description in this document to refer to the same or like parts. The shown shapes and relative dimensions are preferred, but are not meant to be limiting unless specifically claimed, in which case they may limit the scope of that particular claim.

DEFINITIONS

Before describing the combination systems and the figures, some of the terminology should be clarified. Please note that the terms and phrases may have additional definitions and/or examples throughout the specification. Where otherwise not specifically defined, words, phrases, and acronyms are given their ordinary meaning in the art. The following paragraphs provide some of the definitions for terms and phrases used herein.

- The term "water" is being used herein generically to include many types of moisture or fluids including, but not limited to, rain water, snow, dew, water from hoses, and other types of moisture and/or fluid.
- The term "building" is meant to include any structure including, for example, residences and businesses. A building may have at least one exterior building wall (also referred to as an "exterior wall" or a "wall").
- The term "interruption" is used herein to describe openings or edges created by the intersection of a projecting structure and the outside face of an exterior building wall. The description herein is particularly directed to lighting interruptions and box interruptions. Lighting interruptions (also referred to generically as "lighting") include, but are not limited to, sconces, lanterns, carriage lights, or other wall lights designed to hang on a wall. Box interruptions (also referred to generically as "boxes") include, but are not limited to, switch electrical box interruptions, outlet electrical box interruptions, combination switch and outlet electrical box interruptions, or other electrical boxes that can be attached to a wall.
- The phrase "fire-proofing" (and variations thereof) is meant to include the concept of completely preventing damage from fire (fireproof) and the concept of substantially preventing damage from fire (fire resistant). The phrase "fire-proofing" includes more than a minimal amount of preventing damage. Appropriate ratings (e.g. from Underwriters Laboratory, Inc. (UL®)) could be used to designate the time/temperature the combination systems are designed to meet. Modifications to the combination systems (e.g. types of materials and dimensions (e.g. thickness) of the components) may be used to increase the protection provided by the combination systems.

The phrase "water-proofing" (and variations thereof) is meant to include the concept of completely preventing fluids from permeating (waterproof) and the concept of substantially preventing water from permeating (water resistant). The phrase "water-proofing" includes more than a minimal amount of preventing damage. Water-proofing is meant to portray current standards used in building construction.

The term "flashing" is used herein to describe a barrier and/or guide. For example, fire-proofing flashing would add a barrier of fire protection. Another example would be that water-proofing flashing would add a barrier of water protection and/or help guide water away from openings.

The phrase "weather resistant barrier" is used herein to describe weather barriers that prevent water from entering a building. Exemplary weather resistant barrier include, but are not limited to, building felt, adhered membranes, sprayed membranes, wraps (e.g. TYVEK®, SOLITEX®, TYPAR®, CERTAWRAP®, WEATHERMATE®, and house wrap products), and other weather barrier means known or yet to be discovered for protecting walls of buildings from water damage.

Figure 23:
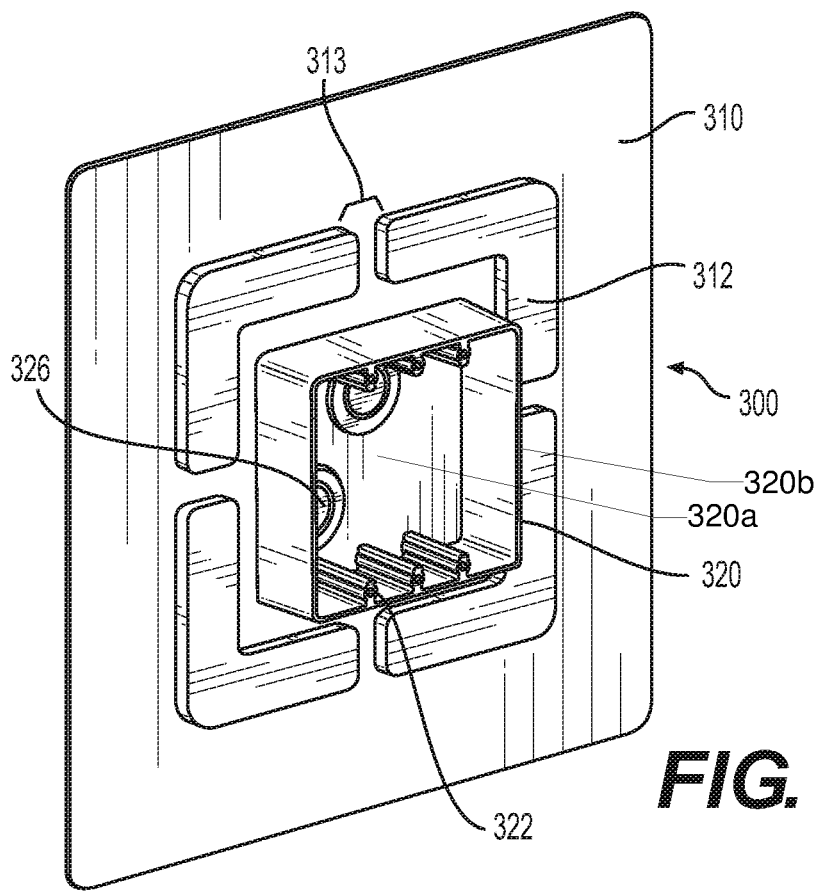
FIG. 23 is a perspective view of a second exemplary combination system.

The term "embossed" (as in the phrase "embossed pattern") is used to describe not the process of construction, but "standing out" of the pattern from the surface. The shown embossed pattern has four raised "L-shaped" corners, with adjacent legs of the "Ls" being separated by a gap. Exemplary gaps are shown as gap 213 (FIG. 16) and gap 313 (FIG. 23). The gaps and the raised portion of the pattern may be used to direct water, allowing water to pass through the gaps and preventing guiding water with the pattern that is standing out from the surface. Water from above the pattern passes through an upper gap, flows downward (gravity), and then is able to escape from a lower gap. As the combination system could be positioned with any edge as an upper edge, gaps are preferably positioned on each side of the pattern.

The term "associated" is defined to mean integral or original, retrofitted, attached, connected (including functionally connected), positioned near, and/or accessible by.

It should be noted that relative terms are meant to help in the understanding of the technology and are not meant to limit the scope of the invention. Similarly, unless specifically stated otherwise, the terms "first," "second," "third," and "fourth" are meant solely for purposes of designation and not for order or limitation.

It should be noted that some terms used in this specification are meant to be relative. For example, the term "front" is meant to be relative to the term "back." The term "top" is meant to be relative to the term "bottom," and the term "side" is meant to describe a "face" or "view" that connects the "front" and the "back." Rotation of the system or component that would change the designation might change the terminology, but not the concept.

The terms "may," "might," "can," and "could" are used to indicate alternatives and optional features and only should be construed as a limitation if specifically included in the claims. It should be noted that the various components, features, steps, or embodiments thereof are all "preferred" whether or not it is specifically indicated. Claims not including a specific limitation should not be construed to include that limitation.

Unless specifically stated otherwise, the term "exemplary" is meant to indicate an example, representation, and/or illustration of a type.

It should be noted that, unless otherwise specified, the term "or" is used in its nonexclusive form (e.g. "A or B" includes, but is not limited to, A, B, A and B, or any combination thereof). It should be noted that, unless otherwise specified, "and/or" is used similarly (e.g. "A and/or B" includes, but is not limited to, A, B, A and B, or any combination thereof). It should be noted that, unless otherwise specified, the terms "includes," "has," and "contains" (and variations of these terms) mean "comprises" (e.g. a device that "includes," "has," or "contains" A and B, comprises A and B, but optionally may contain C or additional components other than A and B).

It should be noted that, unless otherwise specified, the singular forms "a," "an," and "the" refer to one or more than one, unless the context clearly dictates otherwise. Similarly, unless specifically limited, the use of singular language (e.g. "component," "module," or "step") may include plurals (e.g. "components," "modules," or "steps"), unless the context clearly dictates otherwise.

Figure 3:
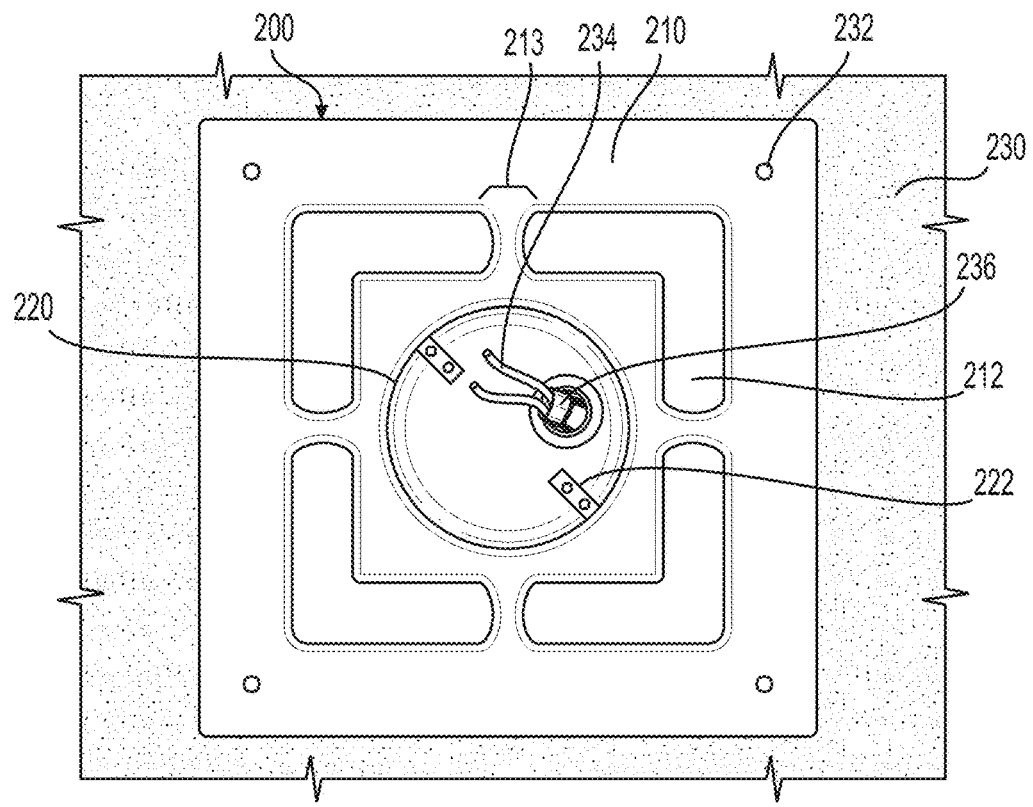
FIG. 3 is a front view of a first exemplary combination system directly attached to exemplary subsiding material.
Figure 4:
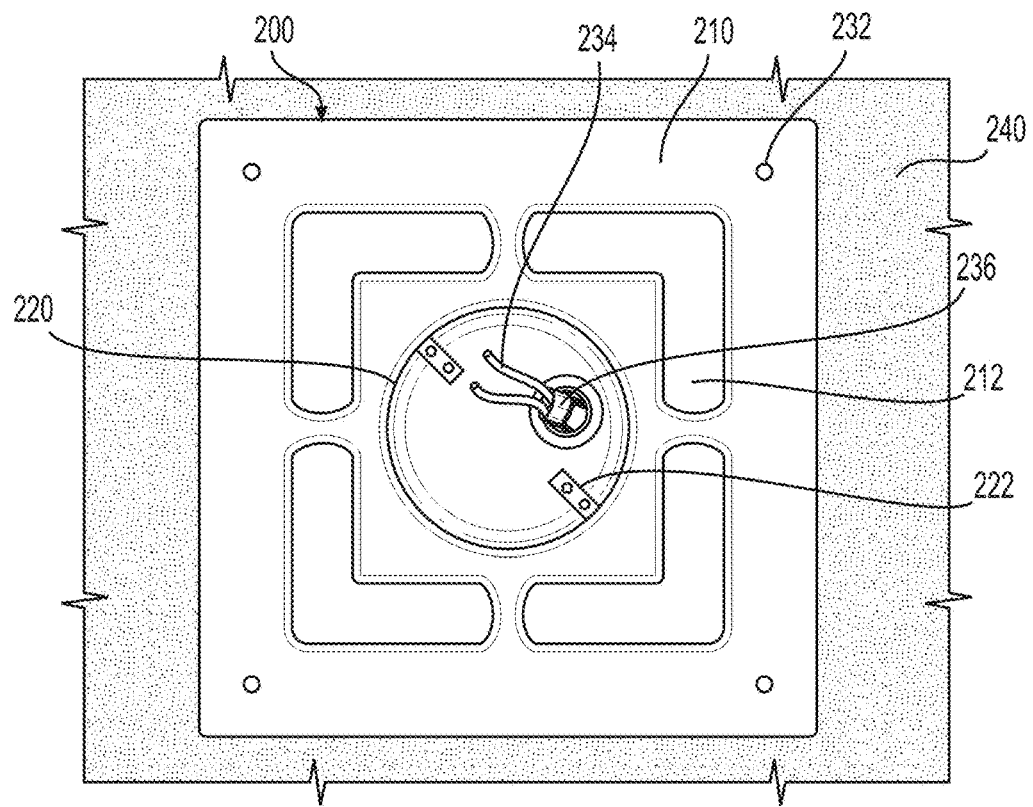
FIG. 4 is a front view of the first exemplary combination system attached to exemplary weather resistant barrier material.
Figure 5:
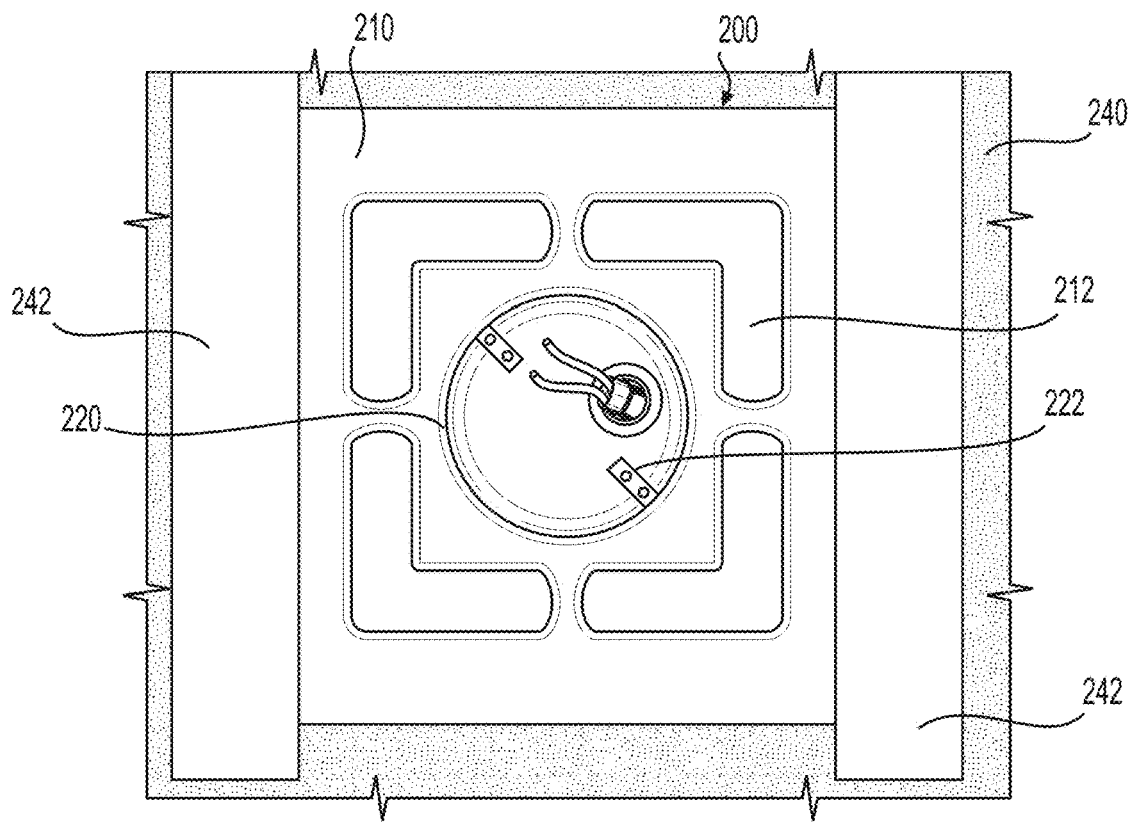
FIG. 5 is a front view of the first exemplary combination system secured on both sides by exemplary weather resistant barrier tape.
Figure 6:
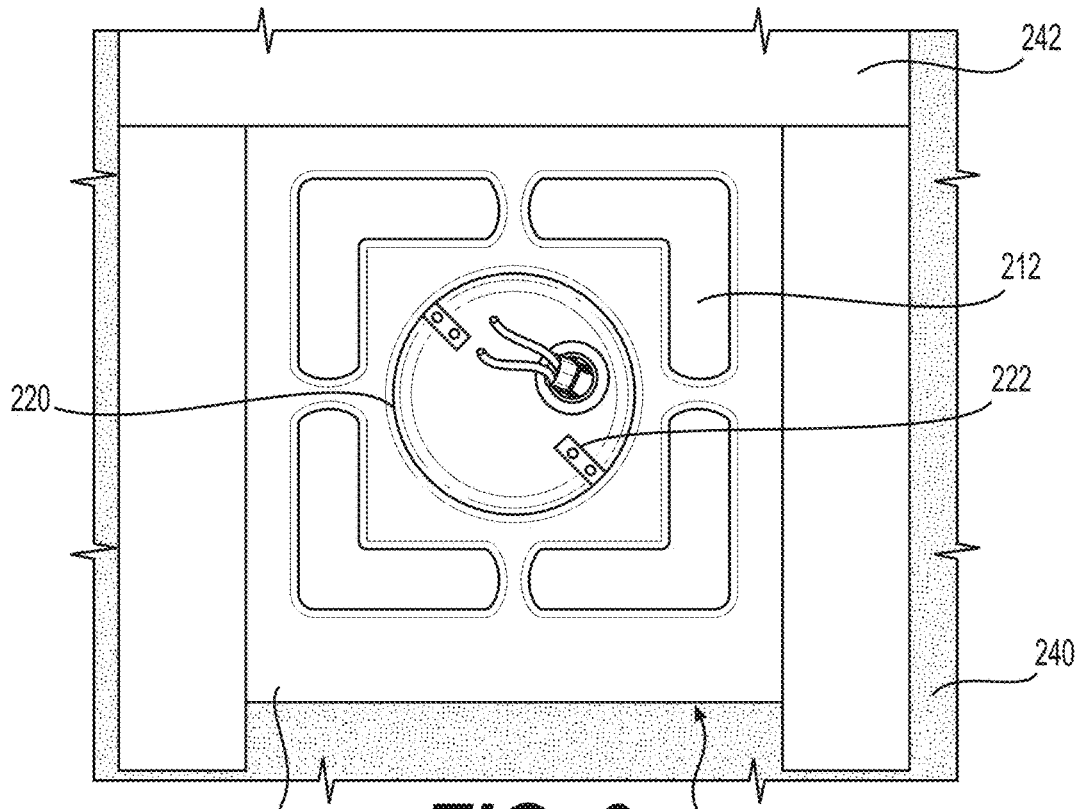
FIG. 6 is a front view of the first exemplary combination system that has been secured on both sides (FIG. 5) being further secured on the top by exemplary weather resistant barrier tape.
Figure 7:
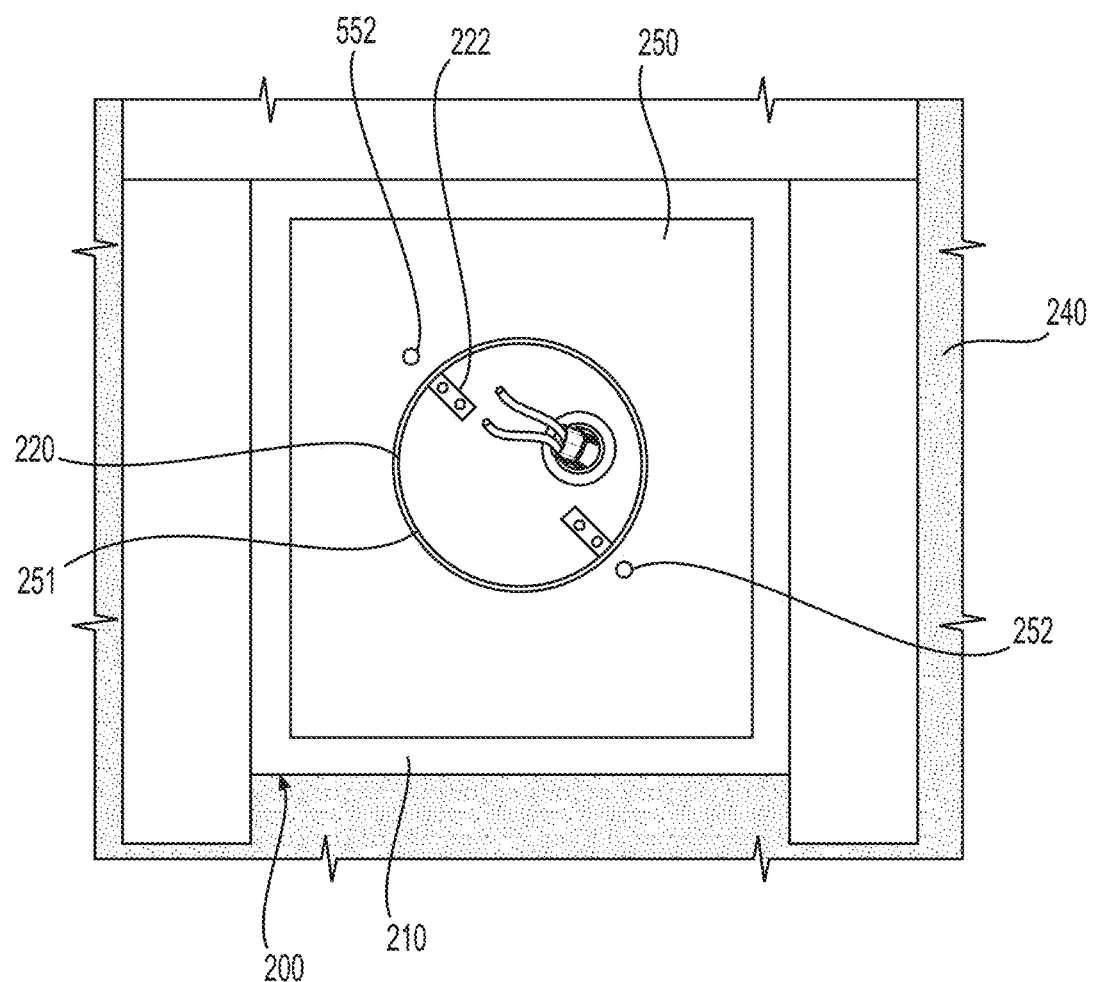
FIG. 7 is a front view of a first exemplary accessory block with a circular aperture, the circular aperture positioned around the enclosure subsystem of the secured first exemplary combination system.
Figure 8:
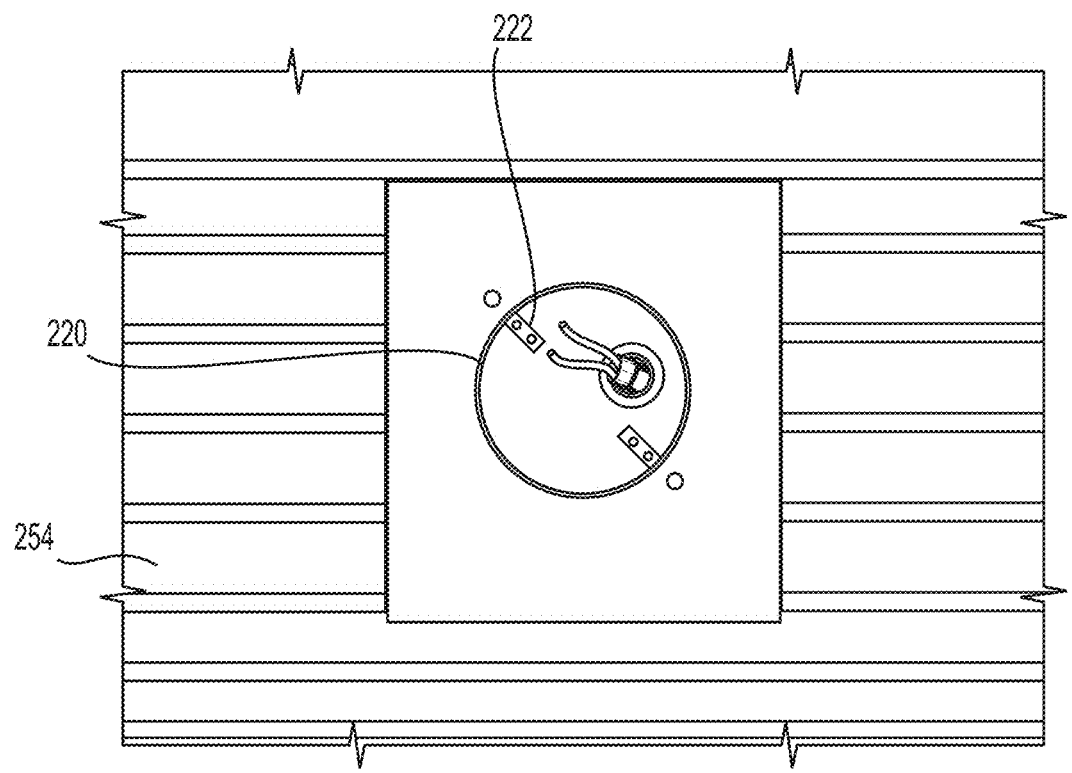
FIG. 8 is a front view of exemplary siding surrounding the first accessory block and the secured first exemplary combination system.
Figure 9:
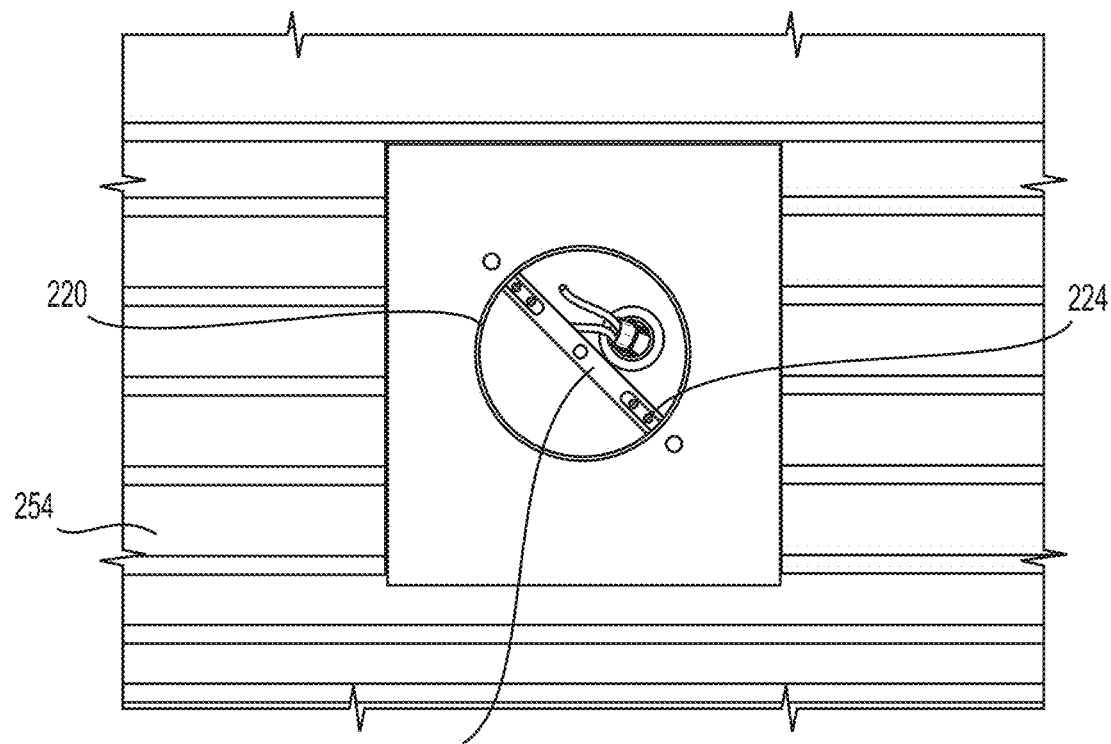
FIG. 9 is a front view of an exemplary light mounting bracket spanning the enclosure subsystem of the first exemplary combination system.
Figure 10:
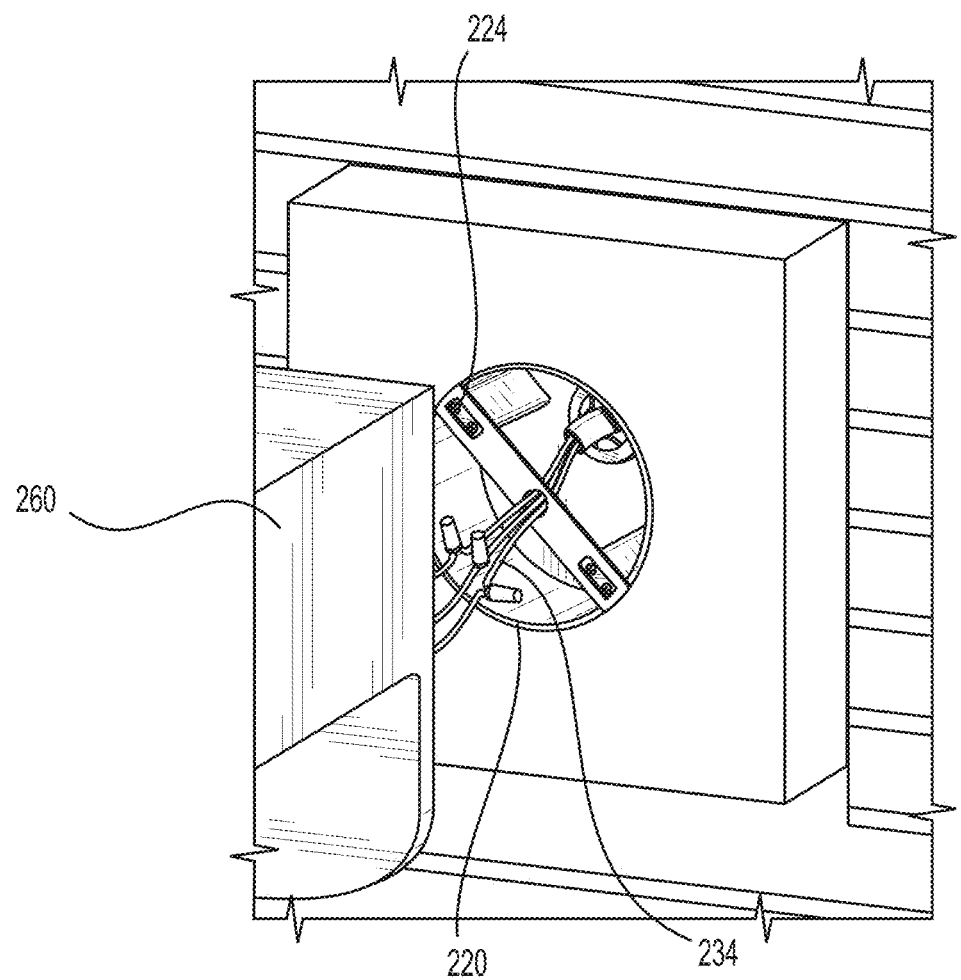
FIG. 10 is an enlarged front perspective view showing an exemplary light being electrically connected to wires protruding into the enclosure subsystem of the first exemplary combination system.
Figure 11:
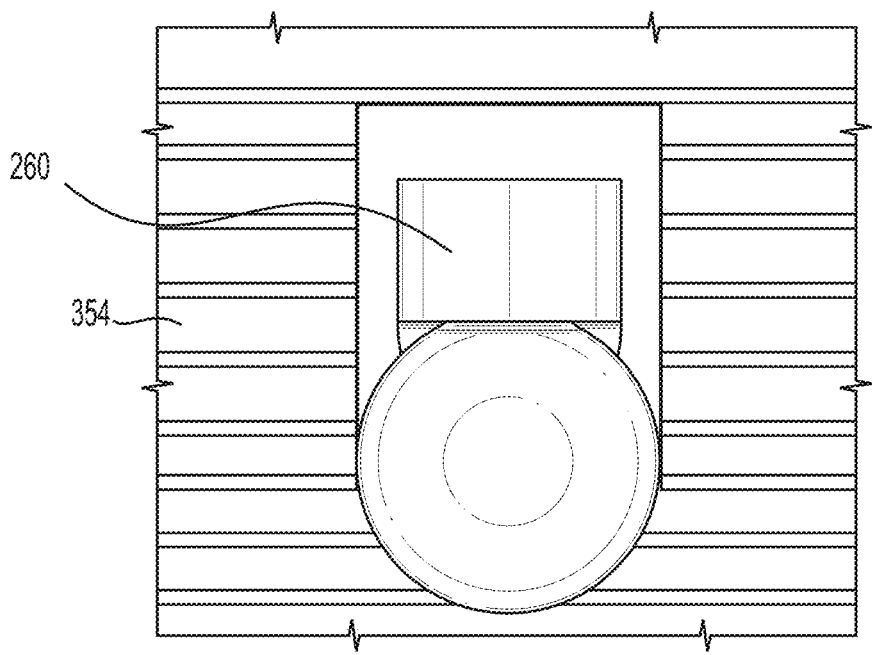
FIG. 11 is a front view of the installed exemplary light.
Figure 12:
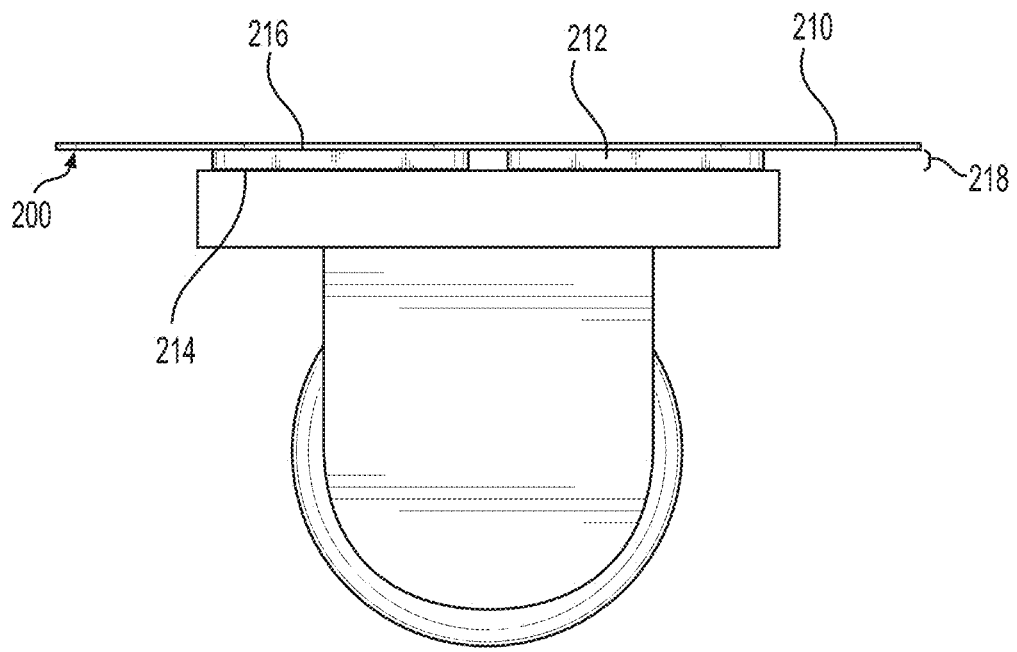
FIG. 12 is a top view of the installed exemplary light and the first exemplary combination system, but with the siding removed to show the spacing created by the embossed pattern between the back surface of the exemplary accessory first block and the top surface of the rear portion of the expanse subsystem of the first exemplary combination system.

FIGS. 3-11 show a series of steps that may be used in an exemplary process for installing a combination system. The steps can be divided into the following steps: (1) preparation (not shown); (2) combination system installation (e.g. as shown in FIG. 3 or FIG. 4); (3) waterproofing (e.g. weather resistant barrier and taping as shown in FIGS. 5 and 6); (4) accessory block and siding installation (FIG. 7 and FIG. 8); and (5) lighting installation (FIGS. 9-11). Some of these steps may be reordered and/or omitted. Further, additional steps may be added. Although these figures show the first exemplary combination system 200, the steps would also at least substantially work with alternative combination systems (e.g. the second exemplary combination system 300, the third exemplary combination system 400, and the fourth exemplary combination system 500).

Although the first exemplary combination system 200 will be discussed in more detail in connection with FIGS. 16-22, the basic features of the first exemplary combination system 200 are described in this paragraph to provide terminology that for describing FIGS. 3-12. The first exemplary combination system 200 has an expanse subsystem 210 and an enclosure subsystem 220 (shown as being circular). As shown, the expanse subsystem 210 includes an embossed pattern 212 such that the expanse subsystem 210 has both a forward portion 214 (the "raised" plane of the embossing or the "raised portion") and a rear portion 216 (the plane from which the embossing has been raised, the plane and the rear portion 216 preferably being substantially coextensive with the back 220a of the enclosure subsystems 220). The forward portion 214 and rear portion 216 are best seen in FIGS. 12 and 19-22. As shown in FIGS. 12 and 19-22, the height 218 of the embossed pattern 212 is the distance between the forward portion 214 and the rear portion 216. The enclosure subsystem 220 includes at least one integral enclosure connector 222 that is designed to mate with a device connector 224 (e.g. a screw). For example, if the device connector 224 were a screw, the enclosure connector 222 could be a channel into which the screw could be inserted. Each enclosure connector 222 may also have multiple channels (as shown). The enclosure connectors 222 may be positioned to accommodate standard mounting brackets 256 for mounting standard lights 260. For example, a pair of enclosure connectors 222 may be positioned opposite each other and substantially near the peripheral wall 220b.

The preparation step includes, but is not limited to, framing, installation of windows and doors, and roughing in electrical. These would be handled as part of the regular construction of a house. Installing a weather resistant barrier 240 (FIG. 4) (which may be thought of as part of the waterproofing step) may be done during the preparation step.

The combination system installation step would include attaching the combination system to the exterior of a building. The first exemplary combination system 200 may be attached directly to exemplary subsiding 230 (FIG. 3) or it may be attached to an exemplary weather resistant barrier 240 (FIG. 4) that covers subsiding.

As shown in FIG. 3, the first exemplary combination system 200 may be attached directly to exemplary subsiding 230 using attachment mechanisms 232 (e.g. nails, screws, staples) through the expanse subsystem 210. (Alternative attaching devices and methods may be used.) Wires 234 from the building construction are pulled into the enclosure subsystem 220. To prevent the ends of the wires 234 from slipping out, the wires 234 may be secured in the enclosure subsystem 220 using a wire securing mechanism 236 (e.g. BLACK BUTTON™ Non-Metallic Cable Connectors or other wire securing means known or yet to be discovered). Although not shown, if the first exemplary combination system 200 is attached directly to exemplary subsiding 230, a weather resistant barrier would be added on top of the expanse subsystem 210 (as part of the weatherproofing step) and the steps shown in FIGS. 5-11 would be performed thereafter.

FIG. 4 shows an alternative to the step shown in FIG. 3 in that the first exemplary combination system 200 is attached to an exemplary weather resistant barrier 240. This assumes that the installation of the weather resistant barrier 240 was performed during the preparation step. As shown in FIG. 4, the first exemplary combination system 200 may be attached to the exemplary weather resistant barrier 240 using attachment mechanisms 232 (e.g. nails, screws, staples) through the expanse subsystem 210. (Alternative attaching devices and methods may be used.) Wires 234 from the building construction are pulled into the enclosure subsystem 220. To prevent the ends of the wires 234 from slipping out, the wires 234 may be secured in the enclosure subsystem 220 using a wire securing mechanism 236 (e.g. BLACK BUTTON™ Non-Metallic Cable Connectors or other wire securing means known or yet to be discovered).

FIGS. 5 and 6 show additional exemplary waterproofing steps (the first step being the installation of the weather resistant barrier 240). In FIG. 5, the first exemplary combination system 200 is secured on both sides by exemplary weather resistant barrier tape 242. In FIG. 6, the first exemplary combination system 200 secured on the top by exemplary weather resistant barrier tape 242. Alternative and/or additional waterproofing steps could be performed.

Figure 44:
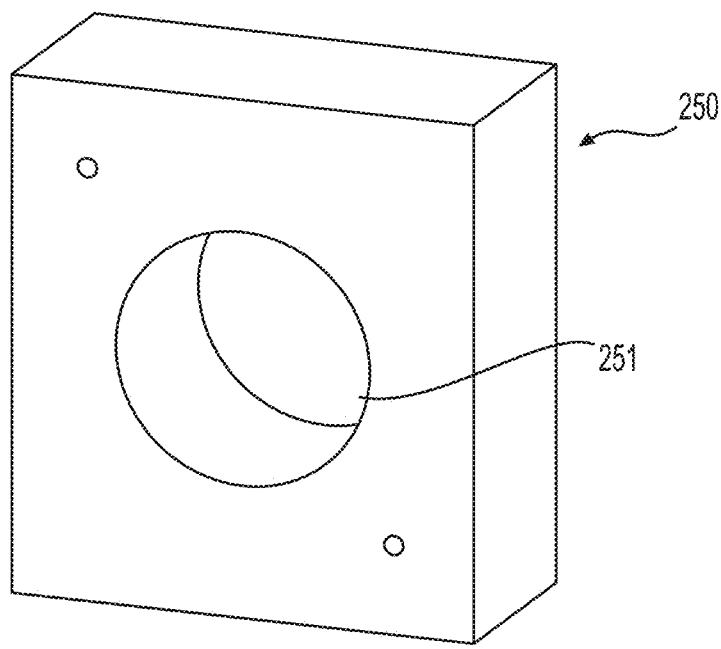
FIG. 44 is a perspective view of a first exemplary accessory block with a circular aperture.

FIGS. 7 and 8 show the step of accessory block and siding installation. FIG. 7 shows a first exemplary accessory block 250 with a circular aperture 251 (shown in detail in FIG. 44) positioned around the enclosure subsystem 220 of the secured first exemplary combination system 200. The first exemplary accessory block 250 may be secured using attachment mechanisms 252 (e.g. nails, screws, staples). The preferred dimensions of the circular aperture 251 are such that the circular aperture 251 fits snuggly (not tight, but not loose) around the peripheral wall 220b of the enclosure subsystem 220. Preferred exemplary accessory blocks may be made from HARDIEPLANK® siding. HARDIEPLANK® siding is generally a fiber cement board that is approximately 1.00" deep. The embossed pattern 212 has a height 218 (FIG. 12) that is designed to position the top surface of the first exemplary accessory block 250 substantially even with the upper rim of the peripheral wall 220b (FIG. 16) of the enclosure subsystem 220. (Put another way, the thickness of the first exemplary accessory block 250 is preferably equal to the distance between the forward portion 214 of the embossed pattern 212 and the upper rim of the peripheral wall 220b.) There is no measuring or adjusting necessary. Prior methods for installing accessory blocks made from HARDIEPLANK® siding required adjustments of either the lowering (e.g. cutting into the subsiding) of the electrical box and/or raising (e.g. shimming) the accessory blocks. The necessity of measuring and making adjustments for each installation is time consuming and often results in poor installations. In addition, measuring and adjustments require additional tools (e.g. drills and saws and the accompanying paraphernalia (e.g. extension cords)) and/or resources that are not necessary with the systems described herein. FIG. 8 shows exemplary siding 254 surrounding the first accessory block 250 and the secured first exemplary combination system 200. It should be noted that although the siding installation would usually be completed before the lighting installation is started, alternative methods could reverse these steps.

The lighting installation step is shown in FIGS. 9-11. FIG. 9 shows an exemplary light mounting bracket 256 spanning the enclosure subsystem 220 of the first exemplary combination system 200. The light mounting bracket 256 may be held in place using one or more device connectors 224 (e.g. a screw) that mate with one or more integral enclosure connectors 222. The shown light mounting bracket 256 is just one of many light mounting brackets that are known in the industry and could be used with the first exemplary combination system 200. Because the integral enclosure connectors 222 are positioned in standard positions, they can be used to mate with all standard light mounting brackets. FIG. 10 shows an exemplary light 260 being electrically connected to wires 234 protruding into the enclosure subsystem 220 of the first exemplary combination system 200. FIG. 11 is a front view of the installed exemplary light 260. Preferably, most known lights can be installed directly to the accessory block 250. A separate cover or faceplate is not needed. This eliminates the necessity of storing, keeping track of, carrying, and installing separate covers or faceplates. For contractors who install hundreds of lights for each job, this can increase efficiency and eliminate unnecessary work.

One of the advantages of the combination systems described herein is that an electrician is only necessary for two steps: the combination system installation step and the lighting installation step. These steps can be performed quickly and efficiently because of the use of the combination systems. Further, the process of "cutting in" a cavity into the siding of a building to accommodate a standard electrical junction box is eliminated, as the combination systems described herein are surface mounted. In fact, because the enclosure subsystem functions as a junction box, a separate junction box is not needed at all. Still further, as set forth, some of the steps that used to be time consuming (e.g. installation of an accessory block), no longer require time-consuming measuring and adjusting. For large buildings or multiple buildings that need hundreds of installations, reducing and simplifying steps can save significant time.

Figure 13:
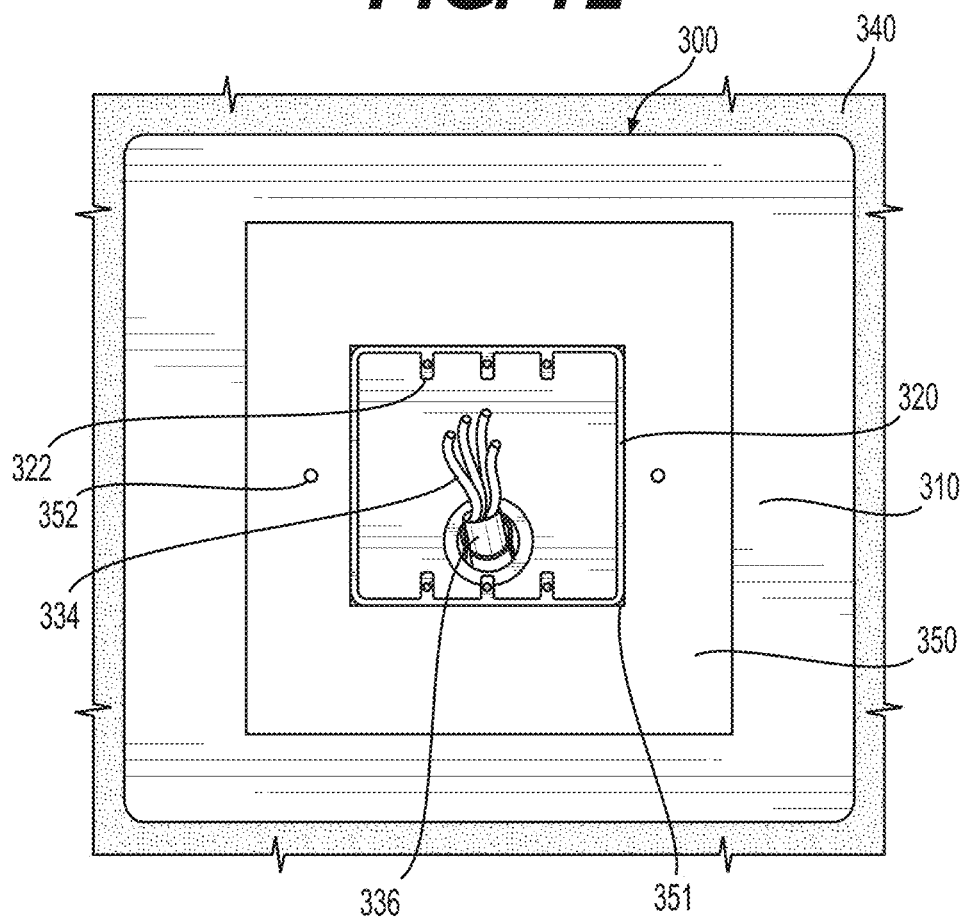
FIG. 13 is a front view of a second exemplary accessory block with a square or rectangular aperture, the square or rectangular aperture positioned around the enclosure subsystem of the secured second exemplary combination system.
Figure 14:
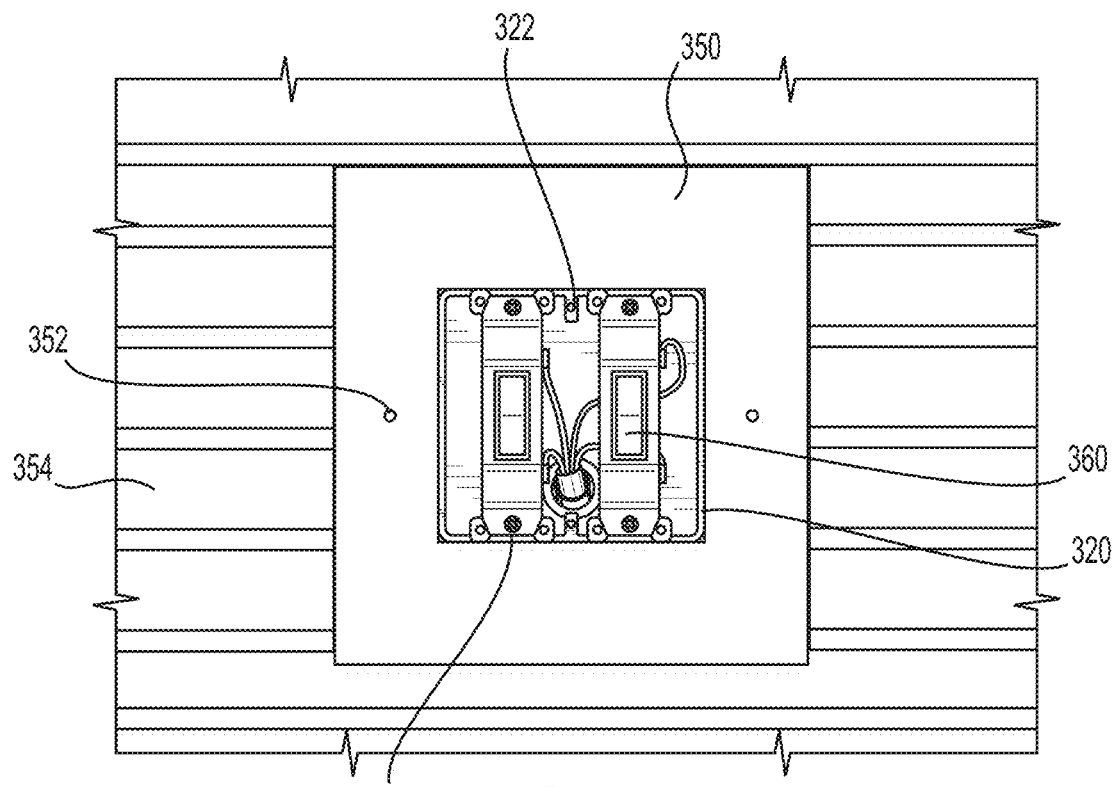
FIG. 14 is a front view of the secured second exemplary combination system with two switches installed therein.
Figure 15:
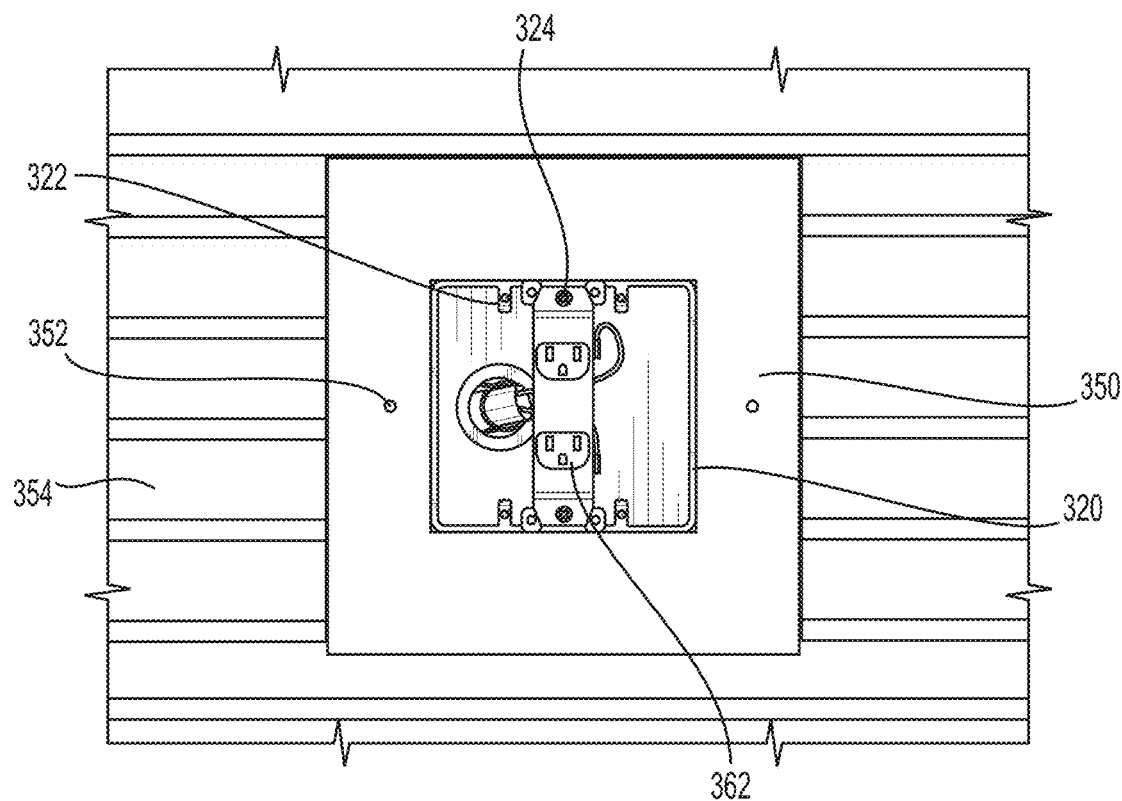
FIG. 15 is a front view of the secured second exemplary combination system with a single outlet installed therein.

FIGS. 13-15 are directed to the secured second exemplary combination system 300. Whereas FIGS. 3-11 show the steps involved in the installation of a light, FIGS. 13-15 show a skeleton set of drawings representing the following steps: (1) preparation (not shown); (2) combination system installation (not shown); (3) waterproofing (not shown); (4) accessory block and siding installation (FIG. 13 shows the accessory block 350 installed, FIGS. 14 and 15 show siding); and (5) switch(s) 360 and/or outlet(s) 362 installation (FIGS. 14 and 15). Most of these steps correspond with the steps shown in FIGS. 3-11 and are incorporated here without repetition.

Figure 24:
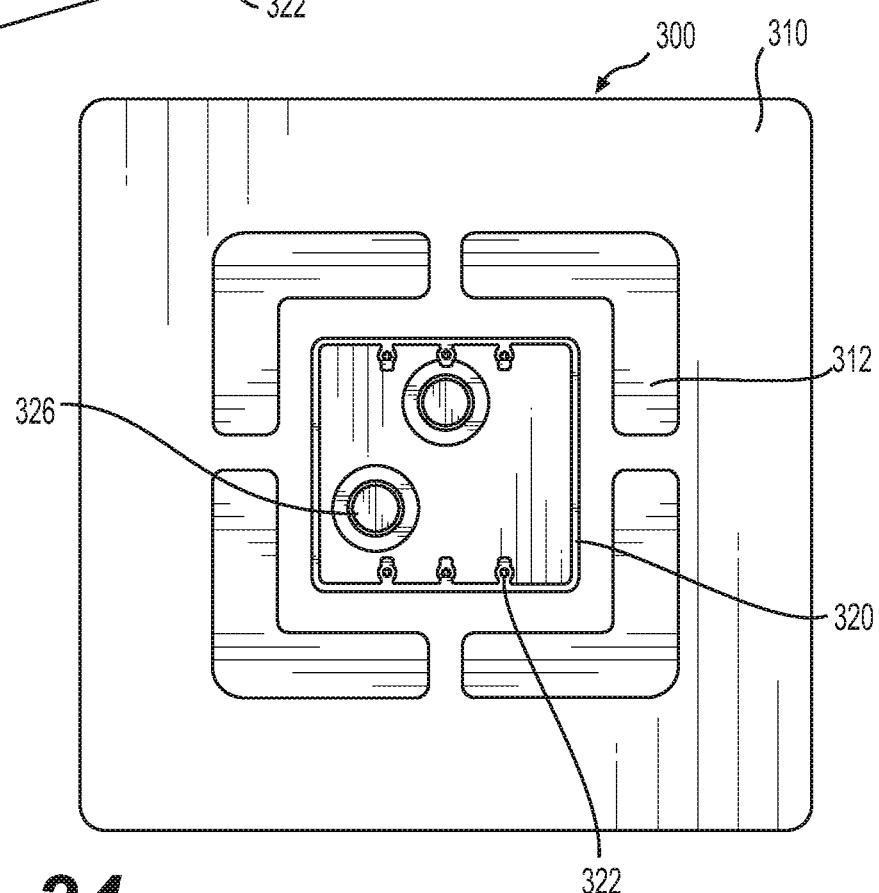
FIG. 24 is a front view of the second exemplary combination system of FIG. 23.
Figure 28:
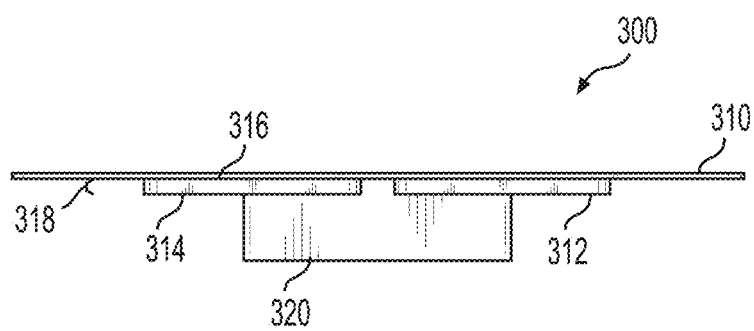
FIG. 28 is a top view of the second exemplary combination system of FIG. 23.
Figure 29:
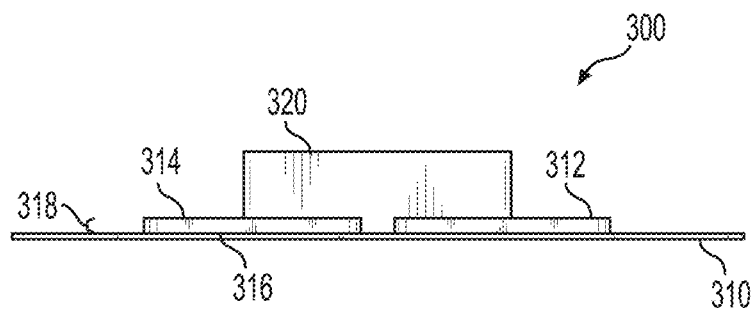
FIG. 29 is a bottom view of the second exemplary combination system of FIG. 23.

Although the second exemplary combination system 300 will be discussed in more detail in connection with FIGS. 23-29, the basic features of the second exemplary combination system 300 are described in this paragraph to provide terminology for describing FIGS. 13-15. The second exemplary combination system 300 has an expanse subsystem 310 and an enclosure subsystem 320 (shown as being square or rectangular). The expanse subsystem 310 includes an embossed pattern 312 (FIGS. 23-29) such that the expanse subsystem 310 has both a forward portion 314 (the "raised" plane of the embossing) and a rear portion 316 (the plane from which the embossing has been raised). The forward portion 314 and rear portion 316 are best seen in FIGS. 26-29. As shown in FIGS. 26-29, the height 318 of the embossed pattern 312 is the distance between the forward portion 314 and the rear portion 316. As shown in FIGS. 23-24, the enclosure subsystem 320 includes at least one integral enclosure connector 322 that is designed to mate with a device connector 324 (e.g. a screw). For example, if the device connector 324 were a screw, the enclosure connector 322 could be a channel into which the screw could be inserted. Each enclosure connector 322 may also have multiple channels (as shown). The enclosure connectors 322 may be positioned to accommodate standard switches 360 and/or outlets 362. For example, the enclosure connectors 322 may be positioned in pairs, with a first of a pair of enclosure connectors 322 positioned substantially near one side of the peripheral wall 320b and a second of a pair of enclosure connectors 322 positioned substantially near an opposite side of the peripheral wall 320b.

Figure 45:
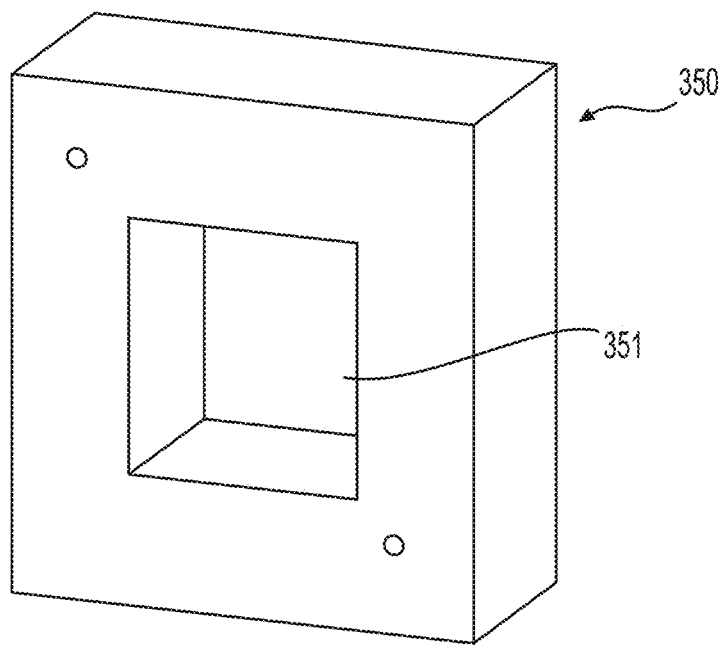
FIG. 45 is a perspective view of a second exemplary accessory block with a square or rectangular aperture.

Before FIG. 13, the exemplary weather resistant barrier 340 would have already been installed. The second exemplary combination system 300 would have already been attached to the exemplary weather resistant barrier 340. And the wires 334 from the building construction would have already been pulled into the enclosure subsystem 320. To prevent the ends of the wires 334 from slipping out, the wires 334 could be secured in the enclosure subsystem 320 using a wire securing mechanism 336 (e.g. BLACK BUTTON™ Non-Metallic Cable Connectors or other wire securing means known or yet to be discovered). Additional waterproofing (e.g. tape) would also have been installed. FIG. 13 shows the second exemplary accessory block 350 (with a square or rectangular aperture 351) the aperture 351 positioned around the enclosure subsystem 320 of the secured second exemplary combination system 300. (The second exemplary accessory block 350 is shown in detail in FIG. 45.) The preferred dimensions of the square or rectangular aperture 351 are such that the square or rectangular aperture 351 fits snuggly (not tight, but not loose) around the peripheral wall 320b of the enclosure subsystem 320. The second exemplary accessory block 350 may be secured using attachment mechanisms 352 (e.g. nails, screws, staples). Between the state of FIG. 13 and the state of FIG. 14, siding 354 would preferably be installed. Similarly, between the state of FIG. 13 and the state of FIG. 15, siding 354 would preferably be installed.

The second exemplary combination system 300 shown in both FIG. 14 and FIG. 15 is the same combination system. Both figures show the enclosure subsystem 320 as having a plurality of integral enclosure connectors 322 that are arranged to allow different configurations of exemplary switches 360 and/or outlets 362. More specifically, the shown enclosure subsystem 320 has three pairs of enclosure connectors 322. If the outer pairs of enclosure connectors 322 are used, two switches/outlets can be installed simultaneously (FIG. 14). If the central pair of enclosure connectors 322 is used, a single central switch/outlet can be installed (FIG. 15). FIG. 14 shows the second exemplary combination system 300 with two switches 360 installed therein, but it could alternatively have had two outlets 362 or one switch 360 and one outlet 362. FIG. 15 shows the second exemplary combination system 300 with a single outlet 362, but it could alternatively have had a single switch 360. Although not shown, a cover (e.g. an "in use cover") may be used to cover the exposed switch(es)/outlet(s).

First Exemplary Combination System 200

FIGS. 16-22 show the first exemplary combination system 200 that includes an expanse subsystem 210 and an enclosure subsystem 220 (shown with a circular peripheral wall). The shown first exemplary combination system 200 is made from WONDERLOY® PC-510 (which is fireproof, waterproof, flexible, and otherwise is able to function as set forth herein). As shown, the materials are 0.19 inches thick, but depending on the materials and desired ratings, the thickness could be approximately between 0.10 inches and 0.25 inches. The expanse subsystem 210 is preferably approximately 10.00 inches to 12.00 inches squared (actually shown as approximately 11.00 inches×11.00 inches). If the height 218 of the enclosure subsystem 220 is approximately 1.25 inches, the radius of the enclosure subsystem 220 preferably is at least 3.60 inches. The dimensions of the enclosure subsystem 220 are determined by factors including current and future laws, rules, and regulations. As shown, the expanse subsystem 210 includes an embossed pattern 212 such that the expanse subsystem 210 has both a forward portion 214 (the "raised" plane of the embossing) and a rear portion 216 (the plane from which the embossing has been raised). The forward portion 214 and rear portion 216 are best seen in FIGS. 19-22. The height 218 of the embossed pattern 212 is designed to position the top surface of the first exemplary accessory block 250 substantially even with the upper rim of the peripheral wall 220b (FIG. 16) of the enclosure subsystem 220. The shown enclosure subsystem 220 includes at least one integral enclosure connector 222 that is designed to mate with a device connector 224 (e.g. a screw). The enclosure subsystem 220 preferably also includes at least one opening 226 or knockout opening suitable to mate with a wire securing mechanism 236 (discussed elsewhere herein).

Second Exemplary Combination System 300 FIGS. 23-29 show the second exemplary combination system 300 that includes an expanse subsystem 310 and an enclosure subsystem 320 (shown with a square or rectangular peripheral wall). The shown second exemplary combination system 300 is made from WONDERLOY® PC-510 (which is fireproof, waterproof, flexible, and otherwise is able to function as set forth herein). As shown, the materials are 0.19 inches thick, but depending on the materials and desired ratings, the thickness could be approximately between 0.10 inches and 0.25 inches. The expanse subsystem 310 is preferably approximately 10.00 inches to 12.00 inches squared (actually shown as approximately 11.00 inches×11.00 inches). If the height of the enclosure subsystem 320 is approximately 1.25 inches, the enclosure subsystem 320 is preferably approximately 3.75 inches to 4.25 inches in width (actually shown as approximately 4.00 inches) and is preferably approximately 3.70 inches to 4.20 inches in length (actually shown as approximately 3.81 inches). The dimensions of the enclosure subsystem 320 are determined by factors including current and future laws, rules, and regulations. As shown, the expanse subsystem 310 includes an embossed pattern 312 such that the expanse subsystem 310 has both a forward portion 314 (the "raised" plane of the embossing) and a rear portion 316 (the plane from which the embossing has been raised). The forward portion 314 and rear portion 316 are best seen in FIGS. 26-29. The height 318 of the embossed pattern 312 is designed to position the top surface of the second exemplary accessory block 350 substantially even with the upper rim of the peripheral wall 320b (FIG. 23) of the enclosure subsystem 320. The shown enclosure subsystem 320 includes at least one integral enclosure connector 322 that is designed to mate with a device connector 324 (e.g. a screw). The enclosure subsystem 320 preferably also includes at least one opening 326 or knockout opening suitable to mate with a wire securing mechanism 336 (discussed elsewhere herein).

Third Exemplary Combination System 400

FIGS. 30-36 show the third exemplary combination system 400 that includes an expanse subsystem 410 and an enclosure subsystem 420 (shown with a circular peripheral wall). The shown third exemplary combination system 400 is made from WONDERLOY® PC-510 (which is fireproof, waterproof, flexible, and otherwise is able to function as set forth herein). As shown, the materials are 0.19 inches thick, but depending on the materials and desired ratings the thickness could be approximately between 0.10 inches and 0.25 inches. The expanse subsystem 410 is preferably approximately 10.00 inches to 12.00 inches squared (actually shown as approximately 11.00 inches×11.00 inches). If the height of the enclosure subsystem 420 is approximately 1.25 inches, the radius of the enclosure subsystem 420 preferably is at least 3.60 inches. The dimensions of the enclosure subsystem 420 are determined by factors including current and future laws, rules, and regulations. The shown enclosure subsystem 420 includes at least one integral enclosure connector 422 that is designed to mate with a device connector (e.g. a screw). The enclosure subsystem 420 preferably also includes at least one opening 426 or knockout opening suitable to mate with a wire securing mechanism (discussed elsewhere herein).

Fourth Exemplary Combination System 500

FIGS. 37-43 show the fourth exemplary combination system 500 that includes an expanse subsystem 510 and an enclosure subsystem 520 (shown with a square or rectangular peripheral wall). The shown fourth exemplary combination system 500 is made from WONDERLOY® PC-510 (which is fireproof, waterproof, flexible, and otherwise is able to function as set forth herein). As shown, the materials are 0.19 inches thick, but depending on the materials and desired ratings the thickness could be approximately between 0.10 inches and 0.25 inches. The expanse subsystem 510 is preferably approximately 10.00 inches to 12.00 inches squared (actually shown as approximately 11.00 inches×11.00 inches). If the height of the enclosure subsystem 520 is approximately 1.25 inches, the radius of the enclosure subsystem 520 preferably is at least 3.60 inches. The dimensions of the enclosure subsystem 520 are determined by factors including current and future laws, rules, and regulations. The shown enclosure subsystem 520 includes at least one integral enclosure connector 522 that is designed to mate with a device connector (e.g. a screw). The enclosure subsystem 520 preferably also includes at least one opening 526 or knockout opening suitable to mate with a wire securing mechanism (discussed elsewhere herein).

It is to be understood that the inventions, examples, and embodiments described herein are not limited to particularly exemplified materials, methods, and/or structures. Dimensions are meant to be exemplary and may be revised for alternative functions. For example, the enclosure subsystem could be smaller if it was designed to hold only a single outlet or switch, and the dimensions could be modified accordingly. It is to be understood that the inventions, examples, and embodiments described herein are to be considered preferred inventions, examples, and embodiments whether specifically identified as such or not. The shown inventions, examples, and embodiments are preferred, but are not meant to be limiting unless specifically claimed, in which case they may limit the scope of that particular claim.

It is to be understood that for methods or procedures disclosed herein that include one or more steps, actions, and/or functions for achieving the described actions and results, the methods' steps, actions, and/or functions may be interchanged with one another without departing from the scope of the present invention. In other words, unless a specific order of steps, actions, and/or functions is required for proper or operative operation of the methods or procedures, the order and/or use of specific steps, actions, and/or functions may be modified without departing from the scope of the present invention.

All references (including, but not limited to, publications, patents, and patent applications) cited herein, whether supra or infra, are hereby incorporated by reference in their entirety.

The terms and expressions that have been employed in the foregoing specification are used as terms of description and not of limitation, and are not intended to exclude equivalents of the features shown and described. While the above is a complete description of selected embodiments of the present invention, it is possible to practice the invention using various alternatives, modifications, adaptations, variations, and/or combinations and their equivalents. It will be appreciated by those of ordinary skill in the art that any arrangement that is calculated to achieve the same purpose may be substituted for the specific embodiment shown. It is also to be understood that the following claims are intended to cover all of the generic and specific features of the invention herein described and all statements of the scope of the invention that, as a matter of language, might be said to fall therebetween.

What is claimed is:

1. A combination system combining a flashing and an electrical junction box system, said combination system for mounting a standard light, the combination system comprising:
   (a) an enclosure subsystem having a back and a single-layer peripheral wall;
   (b) an expanse subsystem, said expanse subsystem substantially coextensive with said back of said enclosure subsystem, said enclosure subsystem centrally positioned in relation to said expanse subsystem; and (c) said enclosure subsystem and said expanse subsystem being an integral unit;

(d) wherein said enclosure subsystem and said expanse subsystem are both fireproof and waterproof; and (e) wherein said combination system is hidden when used to mount behind a standard light.

2. The combination system of claim 1, said enclosure subsystem designed to accommodate electrical wires safely.

3. The combination system of claim 1, at least one integral enclosure connector positioned within said enclosure subsystem.

4. The combination system of claim 1, said expanse subsystem having an embossed pattern thereon.

5. The combination system of claim 1, said expanse subsystem being flexible.

6. The combination system of claim 1, said expanse subsystem having an embossed pattern thereon, said embossed pattern substantially surrounding said enclosure subsystem.

7. The combination system of claim 1, said expanse subsystem having an embossed pattern that includes raised portions and at least one gap between said raised portions, said embossed pattern for directing water.

8. The combination system of claim 1, said peripheral wall having an upper rim, said expanse subsystem having an embossed pattern, said embossed pattern having a forward portion and a rear portion, a distance between said upper rim and said forward portion being equivalent to a thickness of an accessory block.

9. The combination system of claim 1, a distance between said peripheral wall and an outer edge of said expanse subsystem having a length that is approximately equal to the length, width, or diameter of said enclosure subsystem.

10. A combination system combining a flashing and an electrical junction box system, said combination system for mounting a standard light, the combination system comprising:

(a) an enclosure subsystem having a back and a single-layer peripheral wall, said enclosure subsystem designed to accommodate electrical wires safely, at least one integral enclosure connector positioned within said enclosure subsystem;

(b) an expanse subsystem, said expanse subsystem substantially coextensive with said back of said enclosure subsystem, said enclosure subsystem centrally positioned in relation to said expanse subsystem; and (c) said enclosure subsystem and said expanse subsystem being an integral unit;

(d) wherein said enclosure subsystem and said expanse subsystem are both fireproof and waterproof; and (e) wherein said combination system is hidden when used to mount behind a standard light.

11. The combination system of claim 10, said expanse subsystem having an embossed pattern thereon.

12. The combination system of claim 10, said expanse subsystem being flexible.

13. The combination system of claim 10, said expanse subsystem having an embossed pattern thereon, said embossed pattern substantially surrounding said enclosure subsystem.

14. The combination system of claim 10, said expanse subsystem having an embossed pattern that includes raised portions and at least one gap between said raised portions, said embossed pattern for directing water.

15. The combination system of claim 10, said peripheral wall having an upper rim, said expanse subsystem having an embossed pattern, said embossed pattern having a forward portion and a rear portion, a distance between said upper rim and said forward portion being equivalent to a thickness of an accessory block.

16. The combination system of claim 10, a distance between said peripheral wall and an outer edge of said expanse subsystem having a length that is approximately equal to the length, width, or diameter of said enclosure subsystem.

17. A combination system combining a flashing and an electrical junction box system, said combination system for mounting a standard light, the combination system comprising:

(a) an enclosure subsystem having a back and a single-layer peripheral wall, said enclosure subsystem designed to accommodate electrical wires safely, at least one integral enclosure connector positioned within said enclosure subsystem;

(b) an expanse subsystem, said expanse subsystem substantially coextensive with said back of said enclosure subsystem, said enclosure subsystem centrally positioned in relation to said expanse subsystem, said expanse subsystem being flexible; and (c) a distance between said peripheral wall and an outer edge of said expanse subsystem having a length that is approximately equal to the length, width, or diameter of said enclosure subsystem;

(d) said enclosure subsystem and said expanse subsystem being an integral unit;

(e) wherein said enclosure subsystem and said expanse subsystem are both fireproof and waterproof; and (f) wherein said combination system is hidden when used to mount behind a standard light.

18. The combination system of claim 17, said expanse subsystem having an embossed pattern thereon.

19. The combination system of claim 17, said expanse subsystem having an embossed pattern thereon, said embossed pattern substantially surrounding said enclosure subsystem.

20. The combination system of claim 17, said peripheral wall having an upper rim, said expanse subsystem having an embossed pattern, said embossed pattern having a forward portion and a rear portion, a distance between said upper rim and said forward portion being equivalent to a thickness of an accessory block.

* * * * *